United States Patent
Sako et al.

(10) Patent No.: US 7,289,046 B2
(45) Date of Patent: Oct. 30, 2007

(54) DATA RECORDING MEDIUM, DATA RECORDING METHOD AND DEVICE, AND ENCODE METHOD AND DEVICE

(75) Inventors: Yoichiro Sako, Tokyo (JP); Toru Aida, Kanagawa (JP); Tatsuya Inokuchi, Tokyo (JP); Akiya Saito, Kanagawa (JP); Takashi Kihara, Chiba (JP); Tatsushi Sano, Kanagawa (JP); Yoriaki Kanada, Kanagawa (JP); Yoshiro Miyoshi, Kanagawa (JP); Shunsuke Furukawa, Tokyo (JP); Yoshinobu Usui, Kanagawa (JP); Toshihiko Senno, Kanagawa (JP)

(73) Assignees: Sony Corporation, Tokyo (JP); Sony Disc & Digital Solutions Inc., Tokyo (JP)

( * ) Notice: Subject to any disclaimer, the term of this patent is extended or adjusted under 35 U.S.C. 154(b) by 640 days.

(21) Appl. No.: 10/483,622

(22) PCT Filed: May 12, 2003

(86) PCT No.: PCT/JP03/05876
§ 371 (c)(1),
(2), (4) Date: Jan. 14, 2004

(87) PCT Pub. No.: WO03/096344
PCT Pub. Date: Nov. 20, 2003

(65) Prior Publication Data
US 2005/0117491 A1    Jun. 2, 2005

(30) Foreign Application Priority Data
May 14, 2002 (JP) ............... 2002-138199

(51) Int. Cl.
*H03M 7/00* (2006.01)

(52) U.S. Cl. .......................... 341/59; 360/41
(58) Field of Classification Search .................. 341/58, 341/59; 360/41, 48
See application file for complete search history.

(56) References Cited

U.S. PATENT DOCUMENTS 5,349,350 A * 9/1994 Blagaila ...................... 341/59
5,790,056 A * 8/1998 Schouhamer Immink .... 341/58

(Continued)

FOREIGN PATENT DOCUMENTS

JP     62-281523    12/1987

(Continued)

OTHER PUBLICATIONS

U.S. Appl. No. 10/483,622, filed Jan. 14, 2004, Sako et al.

(Continued)

*Primary Examiner*—Howard L. Williams
(74) *Attorney, Agent, or Firm*—Oblon, Spivak, McClelland, Maier & Neustadt, P.C.

(57) ABSTRACT

A recording method for converting m-bit data into n-bit (where n>m) data whose run length is restricted and recording the converted data on a recording medium, the recording method comprising the step of selecting first n-bit data according to an immediately preceded n-bit data, first n-bit data immediately followed thereby, and second n-bit data immediately followed thereby so that the cumulative value of DC components per unit time becomes small.

44 Claims, 23 Drawing Sheets

U.S. PATENT DOCUMENTS

| | | | |
|---|---|---|---|
| 5,828,754 A * | 10/1998 | Hogan | 341/69 |
| 6,768,432 B2 * | 7/2004 | Schouhamer Immink | 341/102 |
| 7,042,951 B2 * | 5/2006 | Wu et al. | 341/58 |
| 2003/0141996 A1 * | 7/2003 | Schouhamer Immink | 341/59 |

FOREIGN PATENT DOCUMENTS

| JP | 6-111486 | 4/1994 |
|---|---|---|
| JP | 7-245565 | 9/1995 |

OTHER PUBLICATIONS

U.S. Appl. No. 10/511,271, filed Oct. 20, 2004, Inokuchi et al.
U.S. Appl. No. 10/436,059, filed May 13, 2003, Sako et al.
U.S. Appl. No. 10/483,261, filed Jan. 14, 2004, Sako et al.
U.S. Appl. No. 10/482,291, filed Dec. 30, 2003, Sako et al.

* cited by examiner

Fig. 2A

| SYNC | 00h | 90h | B9h | 9Ah | B9h | 9Ah | B9h | ⋮ |

Fig. 2B

| SYNC | 40h | 90h | B9h | 9Ah | B9h | 9Ah | B9h | ⋮ |

|   | P | Q | R | S | T | U | V | W |   |
|---|---|---|---|---|---|---|---|---|---|
|   | 0 | 0 | 0 | 0 | 0 | 0 | 0 | 0 | 00h |

*Fig. 6A*

|   | P | Q | R | S | T | U | V | W |   |
|---|---|---|---|---|---|---|---|---|---|
|   | 0 | 1 | 0 | 0 | 0 | 0 | 0 | 0 | 40h |

| HEXADECIMAL | DECIMAL | DATA SYMBOL d1........d8 | CODE SYMBOL C1........C14 |
|---|---|---|---|
| 00h | 000 | 00000000 | 01001000100000 |
| 01h | 001 | 00000001 | 10000100000000 |
| 02h | 002 | 00000010 | 10010000100000 |
| 03h | 003 | 00000011 | 10001000100000 |
| 04h | 004 | 00000100 | 01000100000000 |
| 05h | 005 | 00000101 | 00000100010000 |
| 06h | 006 | 00000110 | 00010000100000 |
| 07h | 007 | 00000111 | 00100100000000 |
| 08h | 008 | 00001000 | 01001001000000 |
| 09h | 009 | 00001001 | 10000001000000 |
| 0Ah | 010 | 00001010 | 10010001000000 |
| 0Bh | 011 | 00001011 | 10001001000000 |
| 0Ch | 012 | 00001100 | 01000001000000 |
| 0Dh | 013 | 00001101 | 00000001000000 |
| 0Eh | 014 | 00001110 | 00010001000000 |
| 0Fh | 015 | 00001111 | 00100001000000 |
| 10h | 016 | 00010000 | 10000000100000 |
| 11h | 017 | 00010001 | 10000010000000 |
| 12h | 018 | 00010010 | 10010010000000 |
| 13h | 019 | 00010011 | 00100000100000 |
| 14h | 020 | 00010100 | 01000010000000 |
| 15h | 021 | 00010101 | 00000010000000 |
| 16h | 022 | 00010110 | 00010010000000 |
| 17h | 023 | 00010111 | 00100010000000 |
| 18h | 024 | 00011000 | 01001000010000 |
| 19h | 025 | 00011001 | 10000000010000 |
| 1Ah | 026 | 00011010 | 10010000010000 |
| 1Bh | 027 | 00011011 | 10001000010000 |
| 1Ch | 028 | 00011100 | 01000000010000 |
| 1Dh | 029 | 00011101 | 00001000010000 |
| 1Eh | 030 | 00011110 | 00010000010000 |
| 1Fh | 031 | 00011111 | 00100000010000 |
| 20h | 032 | 00100000 | 00000000100000 |
| 21h | 033 | 00100001 | 10000100001000 |
| 22h | 034 | 00100010 | 00001000100000 |
| 23h | 035 | 00100011 | 00100100100000 |
| 24h | 036 | 00100100 | 01000100001000 |
| 25h | 037 | 00100101 | 00000100001000 |
| 26h | 038 | 00100110 | 01000000100000 |
| 27h | 039 | 00100111 | 00100100001000 |
| 28h | 040 | 00101000 | 01001001001000 |
| 29h | 041 | 00101001 | 10000001001000 |
| 2Ah | 042 | 00101010 | 10010001001000 |
| 2Bh | 043 | 00101011 | 10001001001000 |
| 2Ch | 044 | 00101100 | 01000001001000 |
| 2Dh | 045 | 00101101 | 00000001001000 |
| 2Eh | 046 | 00101110 | 00010001001000 |
| 2Fh | 047 | 00101111 | 00100001001000 |

Fig. 8

| | | | |
|---|---|---|---|
| 30h | 048 | 00110000 | 00000100000000 |
| 31h | 049 | 00110001 | 10000010001000 |
| 32h | 050 | 00110010 | 10010010001000 |
| 33h | 051 | 00110011 | 10000100010000 |
| 34h | 052 | 00110100 | 01000010001000 |
| 35h | 053 | 00110101 | 00000010001000 |
| 36h | 054 | 00110110 | 00010010001000 |
| 37h | 055 | 00110111 | 00100010001000 |
| 38h | 056 | 00111000 | 01001000001000 |
| 39h | 057 | 00111001 | 10000000001000 |
| 3Ah | 058 | 00111010 | 10010000001000 |
| 3Bh | 059 | 00111011 | 10001000001000 |
| 3Ch | 060 | 00111100 | 01000000001000 |
| 3Dh | 061 | 00111101 | 00001000001000 |
| 3Eh | 062 | 00111110 | 00010000001000 |
| 3Fh | 063 | 00111111 | 00100000001000 |
| 40h | 064 | 01000000 | 01001000100100 |
| 41h | 065 | 01000001 | 10000100100100 |
| 42h | 066 | 01000010 | 10010000100100 |
| 43h | 067 | 01000011 | 10001000100100 |
| 44h | 068 | 01000100 | 01000100100100 |
| 45h | 069 | 01000101 | 00000000100100 |
| 46h | 070 | 01000110 | 00010000100100 |
| 47h | 071 | 01000111 | 00100100100100 |
| 48h | 072 | 01001000 | 01001001000100 |
| 49h | 073 | 01001001 | 10000001000100 |
| 4Ah | 074 | 01001010 | 10010001000100 |
| 4Bh | 075 | 01001011 | 10001001000100 |
| 4Ch | 076 | 01001100 | 01000001000100 |
| 4Dh | 077 | 01001101 | 00000001000100 |
| 4Eh | 078 | 01001110 | 00010001000100 |
| 4Fh | 079 | 01001111 | 00100001000100 |
| 50h | 080 | 01010000 | 10000000100100 |
| 51h | 081 | 01010001 | 10000010000100 |
| 52h | 082 | 01010010 | 10010010000100 |
| 53h | 083 | 01010011 | 00100000100100 |
| 54h | 084 | 01010100 | 01000010000100 |
| 55h | 085 | 01010101 | 00000010000100 |
| 56h | 086 | 01010110 | 00010010000100 |
| 57h | 087 | 01010111 | 00100010000100 |
| 58h | 088 | 01011000 | 01001000000100 |
| 59h | 089 | 01011001 | 10000000000100 |
| 5Ah | 090 | 01011010 | 10010000000100 |
| 5Bh | 091 | 01011011 | 10001000000100 |
| 5Ch | 092 | 01011100 | 01000000000100 |
| 5Dh | 093 | 01011101 | 00001000000100 |
| 5Eh | 094 | 01011110 | 00010000000100 |
| 5Fh | 095 | 01011111 | 00100000000100 |
| 60h | 096 | 01100000 | 01001000100010 |
| 61h | 097 | 01100001 | 10000100100010 |

Fig. 9

| | | | |
|---|---|---|---|
| 62h | 098 | 01100010 | 10010000100010 |
| 63h | 099 | 01100011 | 10001000100010 |
| 64h | 100 | 01100100 | 01000100100010 |
| 65h | 101 | 01100101 | 00000000100010 |
| 66h | 102 | 01100110 | 01000000100100 |
| 67h | 103 | 01100111 | 00100100100010 |
| 68h | 104 | 01101000 | 01001001000010 |
| 69h | 105 | 01101001 | 10000001000010 |
| 6Ah | 106 | 01101010 | 10010001000010 |
| 6Bh | 107 | 01101011 | 10001001000010 |
| 6Ch | 108 | 01101100 | 01000001000010 |
| 6Dh | 109 | 01101101 | 00000001000010 |
| 6Eh | 110 | 01101110 | 00010001000010 |
| 6Fh | 111 | 01101111 | 00100001000010 |
| 70h | 112 | 01110000 | 10000000100010 |
| 71h | 113 | 01110001 | 10000010000010 |
| 72h | 114 | 01110010 | 10010010000010 |
| 73h | 115 | 01110011 | 00100000100010 |
| 74h | 116 | 01110100 | 01000010000010 |
| 75h | 117 | 01110101 | 00000010000010 |
| 76h | 118 | 01110110 | 00010010000010 |
| 77h | 119 | 01110111 | 00100010000010 |
| 78h | 120 | 01111000 | 01001000000010 |
| 79h | 121 | 01111001 | 00001001001000 |
| 7Ah | 122 | 01111010 | 10010000000010 |
| 7Bh | 123 | 01111011 | 10001000000010 |
| 7Ch | 124 | 01111100 | 01000000000010 |
| 7Dh | 125 | 01111101 | 00001000000010 |
| 7Eh | 126 | 01111110 | 00010000000010 |
| 7Fh | 127 | 01111111 | 00100000000010 |
| 80h | 128 | 10000000 | 01001000100001 |
| 81h | 129 | 10000001 | 10000100100001 |
| 82h | 130 | 10000010 | 10010000100001 |
| 83h | 131 | 10000011 | 10001000100001 |
| 84h | 132 | 10000100 | 01000100100001 |
| 85h | 133 | 10000101 | 00000000100001 |
| 86h | 134 | 10000110 | 00010000100001 |
| 87h | 135 | 10000111 | 00100100100001 |
| 88h | 136 | 10001000 | 01001001000001 |
| 89h | 137 | 10001001 | 10000001000001 |
| 8Ah | 138 | 10001010 | 10010001000001 |
| 8Bh | 139 | 10001011 | 10001001000001 |
| 8Ch | 140 | 10001100 | 01000001000001 |
| 8Dh | 141 | 10001101 | 00000001000001 |
| 8Eh | 142 | 10001110 | 00010001000001 |
| 8Fh | 143 | 10001111 | 00100001000001 |
| 90h | 144 | 10010000 | 10000000100001 |
| 91h | 145 | 10010001 | 10000010000001 |
| 92h | 146 | 10010010 | 10010010000001 |
| 93h | 147 | 10010011 | 00100000100001 |

Fig. 10

| | | | |
|---|---|---|---|
| 94h | 148 | 10010100 | 01000010000001 |
| 95h | 149 | 10010101 | 00000010000001 |
| 96h | 150 | 10010110 | 00010010000001 |
| 97h | 151 | 10010111 | 00100010000001 |
| 98h | 152 | 10011000 | 01001000000001 |
| 99h | 153 | 10011001 | 10000010010000 |
| 9Ah | 154 | 10011010 | 10010000000001 |
| 9Bh | 155 | 10011011 | 10001000000001 |
| 9Ch | 156 | 10011100 | 01000010010000 |
| 9Dh | 157 | 10011101 | 00001000000001 |
| 9Eh | 158 | 10011110 | 00010000000001 |
| 9Fh | 159 | 10011111 | 00100010010000 |
| A0h | 160 | 10100000 | 00001000100001 |
| A1h | 161 | 10100001 | 10000100001001 |
| A2h | 162 | 10100010 | 01000100010000 |
| A3h | 163 | 10100011 | 00000100100001 |
| A4h | 164 | 10100100 | 01000100001001 |
| A5h | 165 | 10100101 | 00000100001001 |
| A6h | 166 | 10100110 | 01000000100001 |
| A7h | 167 | 10100111 | 00100100001001 |
| A8h | 168 | 10101000 | 01001001001001 |
| A9h | 169 | 10101001 | 10000001001001 |
| AAh | 170 | 10101010 | 10010001001001 |
| ABh | 171 | 10101011 | 10001001001001 |
| ACh | 172 | 10101100 | 01000001001001 |
| ADh | 173 | 10101101 | 00000001001001 |
| AEh | 174 | 10101110 | 00010001001001 |
| AFh | 175 | 10101111 | 00100001001001 |
| B0h | 176 | 10110000 | 00000100100000 |
| B1h | 177 | 10110001 | 10000010001001 |
| B2h | 178 | 10110010 | 10010010001001 |
| B3h | 179 | 10110011 | 00100100010000 |
| B4h | 180 | 10110100 | 01000010001001 |
| B5h | 181 | 10110101 | 00000010001001 |
| B6h | 182 | 10110110 | 00010010001001 |
| B7h | 183 | 10110111 | 00100010001001 |
| B8h | 184 | 10111000 | 01001000001001 |
| B9h | 185 | 10111001 | 10000000001001 |
| BAh | 186 | 10111010 | 10010000001001 |
| BBh | 187 | 10111011 | 10001000001001 |
| BCh | 188 | 10111100 | 01000000001001 |
| BDh | 189 | 10111101 | 00001000001001 |
| BEh | 190 | 10111110 | 00010000001001 |
| BFh | 191 | 10111111 | 00100000001001 |
| C0h | 192 | 11000000 | 01000100100000 |
| C1h | 193 | 11000001 | 10000100010001 |
| C2h | 194 | 11000010 | 10010010010000 |
| C3h | 195 | 11000011 | 00001000100100 |
| C4h | 196 | 11000100 | 01000100010001 |
| C5h | 197 | 11000101 | 00000100010001 |

Fig. 11

| | | | |
|---|---|---|---|
| C6h | 198 | 11000110 | 000100100100000 |
| C7h | 199 | 11000111 | 001001000010001 |
| C8h | 200 | 11001000 | 000010010000001 |
| C9h | 201 | 11001001 | 100001000000001 |
| CAh | 202 | 11001010 | 000010010000100 |
| CBh | 203 | 11001011 | 000010010000000 |
| CCh | 204 | 11001100 | 010001000000001 |
| CDh | 205 | 11001101 | 000001000000001 |
| CEh | 206 | 11001110 | 000000100010000 |
| CFh | 207 | 11001111 | 001001000000001 |
| D0h | 208 | 11010000 | 000001001000100 |
| D1h | 209 | 11010001 | 100000100010001 |
| D2h | 210 | 11010010 | 100100100010001 |
| D3h | 211 | 11010011 | 100001001000000 |
| D4h | 212 | 11010100 | 010000100010001 |
| D5h | 213 | 11010101 | 000000100010001 |
| D6h | 214 | 11010110 | 000100100010001 |
| D7h | 215 | 11010111 | 001000100010001 |
| D8h | 216 | 11011000 | 010010000010001 |
| D9h | 217 | 11011001 | 100000000100001 |
| DAh | 218 | 11011010 | 100100000010001 |
| DBh | 219 | 11011011 | 100010000010001 |
| DCh | 220 | 11011100 | 010000000010001 |
| DDh | 221 | 11011101 | 000010000010001 |
| DEh | 222 | 11011110 | 000100000010001 |
| DFh | 223 | 11011111 | 001000000010001 |
| E0h | 224 | 11100000 | 010001000000010 |
| E1h | 225 | 11100001 | 000001000000010 |
| E2h | 226 | 11100010 | 100001000010010 |
| E3h | 227 | 11100011 | 001001000000010 |
| E4h | 228 | 11100100 | 010001000010010 |
| E5h | 229 | 11100101 | 000001000010010 |
| E6h | 230 | 11100110 | 010000000100010 |
| E7h | 231 | 11100111 | 001001000010010 |
| E8h | 232 | 11101000 | 100001000000010 |
| E9h | 233 | 11101001 | 100001000000100 |
| EAh | 234 | 11101010 | 000010010010001 |
| EBh | 235 | 11101011 | 000010010000010 |
| ECh | 236 | 11101100 | 010001000000100 |
| EDh | 237 | 11101101 | 000001000000100 |
| EEh | 238 | 11101110 | 000100000100010 |
| EFh | 239 | 11101111 | 001001000000100 |
| F0h | 240 | 11110000 | 000001001000010 |
| F1h | 241 | 11110001 | 100000100010010 |
| F2h | 242 | 11110010 | 100100100010010 |
| F3h | 243 | 11110011 | 000010001000010 |
| F4h | 244 | 11110100 | 010000100010010 |
| F5h | 245 | 11110101 | 000000100010010 |
| F6h | 246 | 11110110 | 000100100010010 |
| F7h | 247 | 11110111 | 001000100010010 |

Fig. 12

| | | | |
|---|---|---|---|
| F8h | 248 | 11111000 | 01001000010010 |
| F9h | 249 | 11111001 | 10000000010010 |
| FAh | 250 | 11111010 | 10010000010010 |
| FBh | 251 | 11111011 | 10001000010010 |
| FCh | 252 | 11111100 | 01000000010010 |
| FDh | 253 | 11111101 | 00001000010010 |
| FEh | 254 | 11111110 | 00010000010010 |
| FFh | 255 | 11111111 | 00100000010010 |

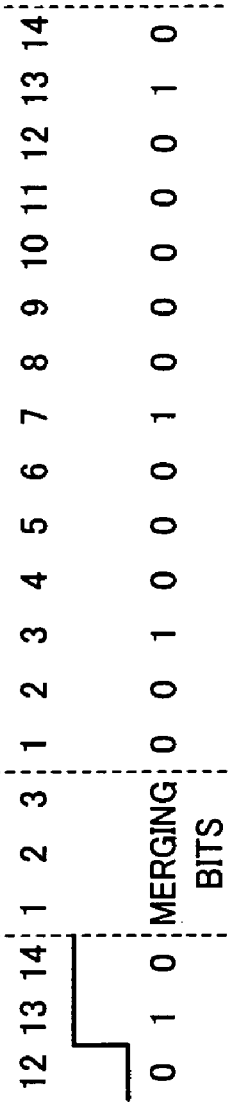
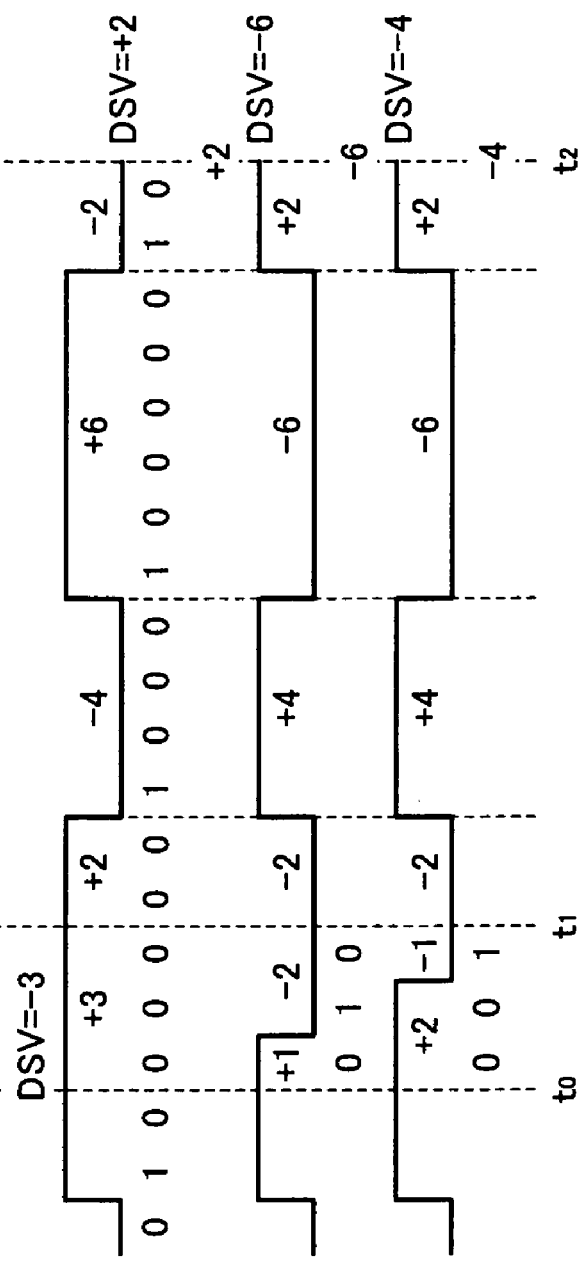
Fig. 13A
Fig. 13B
Fig. 13C
Fig. 13D

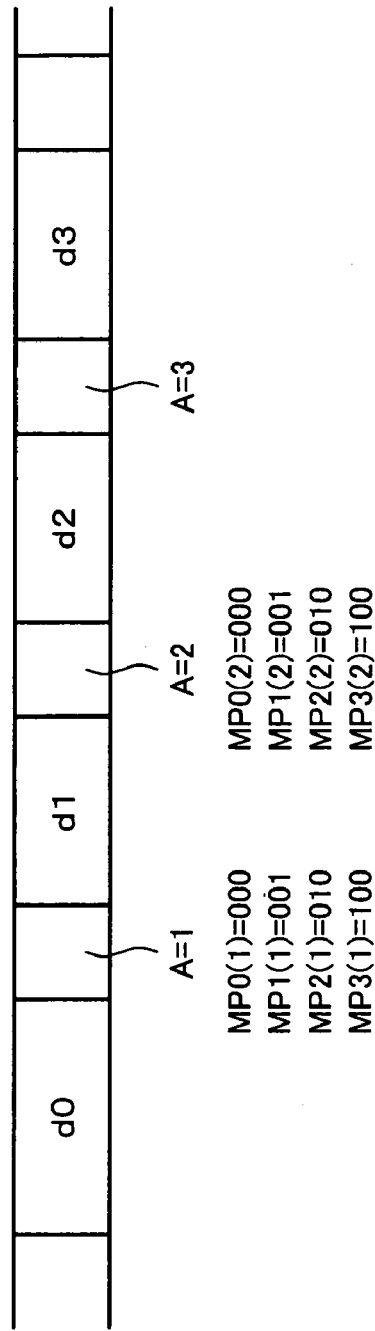
Fig. 20A
Fig. 20B

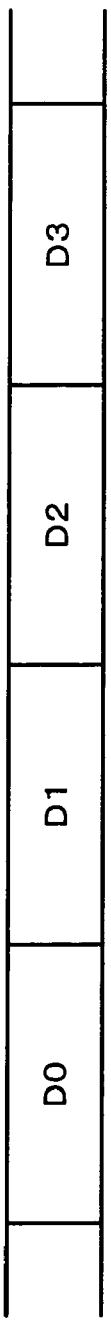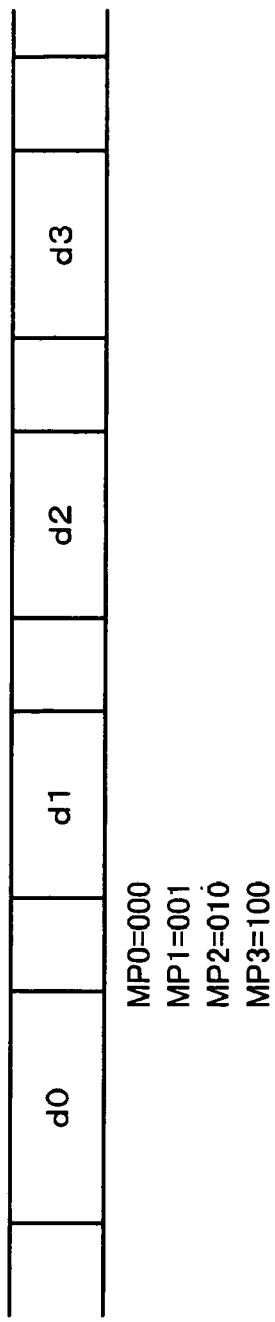
Fig. 23A
Fig. 23B

DATA RECORDING MEDIUM, DATA RECORDING METHOD AND DEVICE, AND ENCODE METHOD AND DEVICE

TECHNICAL FIELD

The present invention relates to a data recording medium, a data recording method, a data recording apparatus, an encoding method, and an encoding apparatus that are applicable to for example an optical disc.

BACKGROUND ART

Since optical discs such as a CD (Compact Disc) and a CD-ROM (Compact Disc Read Only Memory) are easy to handle and are produced at relatively low cost, they have been widely used as recording mediums for storing data. In recent years, a CD-R (Compact Disc Recordable) disc, on which data can be recorded once, and a CD-RW (Compact Disc ReWritable) disc, on which data can be rewritten, have come out. Thus, data can be easily recorded on such recordable optical discs. As a result, optical discs that accord with the CD standard such as a CD-DA (Compact Disc Digital Audio) disc, a CD-ROM disc, a CD-R disc, and a CD-RW disc have become the mainstream of data recording mediums. In addition, in recent years, audio data is compressed according to the MP3 (MPEG1 Audio Layer-3) and the ATRAC (Adaptive TRansform Acoustic Coding) 3 and recorded on the CD-R disc, the CD-RW disc, and so forth.

However, as a CD-R disc and a CD-RW disc have come out, data recoded on a CD disc can be easily copied to these discs. As a result, a problem about copyright protection has arisen. Thus, when content data is recorded to a CD disc, it is necessary to take measures to protect content data.

As a conventional copy protection technology for protecting a copy of data from a CD-ROM disc to a CD-R disc or a CD-RW disc, a method for physically deforming a disc with for example wobble pits has been proposed. In the physically deforming method, however, if an original disc is a CD-R disc or a CD-RW disc, the copy protection cannot be performed.

In addition, to protect a copying operation, a method for encrypting content data has been proposed. However, even if content data has been encrypted, a disc on which the same data as an original disc is recorded can be produced.

To protect content data recorded on a CD disc that accords with the CD standard, there is a method for determining whether the disc is an original CD or a CD whose data has been copied from an original CD (this CD is referred to as copied CD). When the disc is an original CD, a copying operation thereof can be permitted. When the disc is a disc whose data has been copied from an original disc (this disc is referred to as copied disc), a further copying operation thereof can be prohibited.

To determine whether the disc is an original disc or a copied disc, a method for placing a defect on a disc in a master disc production stage, detecting the defect from the disc during a reproduction, and determining that the disc is an original disc based on the detected defect has been proposed. In this method, however, an original disc may contain such a defect. In addition, depending on the type of a defect, it may be copied as it is. Thus, content data of an original disc cannot be prevented from being copied to a CD-R disc.

Therefore, an object of the present invention is to provide a data recording medium, a data recording method, and a data recording apparatus that contribute to copy protection without need to physically deform a medium and intentionally place a defect thereon.

DISCLOSURE OF THE INVENTION

Claim 1 of the present invention is a recording method for converting m-bit data into an n-bit (where n>m) data symbol whose run length is restricted and placing a connection bit after the m-bit data symbol so that the cumulative value of DC components per unit time becomes small, the recording method comprising the steps of selecting a first connection bit to be added to an immediately preceded data symbol from a plurality of connection bits according to at least one first connection bit that can be added between the immediately preceded data symbol and a first data symbol immediately followed thereby and according to at least one second connection bit that can be added between the first data symbol and at least one second data symbol immediately followed thereby; adding the selected first connection bit to the immediately preceded data symbol so as to generate record data; and recording the generated record data on a recording medium.

Claim 4 of the present invention is a recording method for converting m-bit data into an n-bit (where n>m) data symbol whose run,length is restricted and adding a connection bit after the m-bit data symbol so that the cumulative value of DC components per unit time becomes small, the recording method comprising the steps of when an immediately preceded data symbol is a special data symbol, selecting a first connection bit to be added to the immediately preceded data symbol from a plurality of connection bits according to at least one first connection bit that can be added between the immediately preceded data symbol and a first data symbol immediately followed thereby and according to at least one second connection bit that can be added between the first data symbol and at least one second data symbol immediately followed thereby; adding the selected first connection bit to the immediately preceded data symbol so as to generate record data; and recording the generated record data on a recording medium.

Claim 9 of the present invention is a recording method for converting m-bit data into n-bit (where n>m) data whose run length is restricted and recording the converted data on a recording medium, the recording method comprising the step of selecting first n-bit data according to an immediately preceded n-bit data, first n-bit data immediately followed thereby, and second n-bit data immediately followed thereby so that the cumulative value of DC components per unit time becomes small.

Claim 19 of the present invention is a recording apparatus, comprising an encoding process portion for performing an encoding process for input data; a converting portion for converting m-bit data that is output from the encoding processing portion into n-bit (where n>m) data whose run length is restricted by selecting first n-bit data according to an immediately preceded n-bit data, first n-bit data immediately followed thereby, and second n-bit data immediately followed thereby so that the cumulative value of DC components per unit time becomes small; and a recording portion for recording data that is output from the converting portion on a recording medium.

Claim 29 of the present invention is a recording medium on which when m-bit data is converted into n-bit (where n>m) data whose run length is restricted, first n-bit data is selected according to an immediately preceded n-bit data, first n-bit data immediately followed thereby, and second n-bit data immediately followed thereby so that the cumulative value of DC components per unit time becomes small and the selected first n-bit data is recorded after the immediately preceded n-bit data.

Claim 39 of the present invention is a data converting method, comprising the step of when m-bit data is converted into n-bit (where n>m) data whose run length is restricted, selecting first n-bit data according to an immediately preceded n-bit data, first n-bit data immediately followed thereby, and second n-bit data immediately followed thereby so that the cumulative value of DC components per unit time becomes small.

BRIEF DESCRIPTION OF THE DRAWINGS

FIG. 2A and FIG. 2B are schematic diagrams showing an example of a special pattern recorded on a disc.

FIG. 6A and FIG. 6B are schematic diagrams describing data of a sub code.

FIG. 7 is a schematic diagram showing an EFM conversion table.

FIG. 8 is a schematic diagram showing an EFM conversion table.

FIG. 9 is a schematic diagram showing an EFM conversion table.

FIG. 10 is a schematic diagram showing an EFM conversion table.

FIG. 11 is a schematic diagram showing an EFM conversion table.

FIG. 12 is a schematic diagram showing an EFM conversion table.

FIG. 13A to FIG. 13D are schematic diagrams describing a method for selecting merging bits.

FIG. 20A and FIG. 20B are schematic diagrams describing the merging bit selecting process performed by the modulator according to the present invention.

FIG. 23A and FIG. 23B are schematic diagrams describing the merging bit selecting process performed by the conventional modulator.

BEST MODES FOR CARRYING OUT THE INVENTION

Next, with reference to the accompanying drawings, an embodiment of the present invention will be described. In this example, copy restriction is performed with a special pattern of which when connection bits (hereinafter referred to as merging bits) are selected in the EFM (eight to fourteen modulation) modulation, the merging bits selected when DSV (Digital Sum Variation) is controlled according to the relation of an immediately preceded code symbol and a code symbol immediately followed thereby are different from the merging bits selected in the EFM modulation when DSV is controlled according to the relation of that code symbol and a code symbol further immediately followed thereby.

Figure 1:
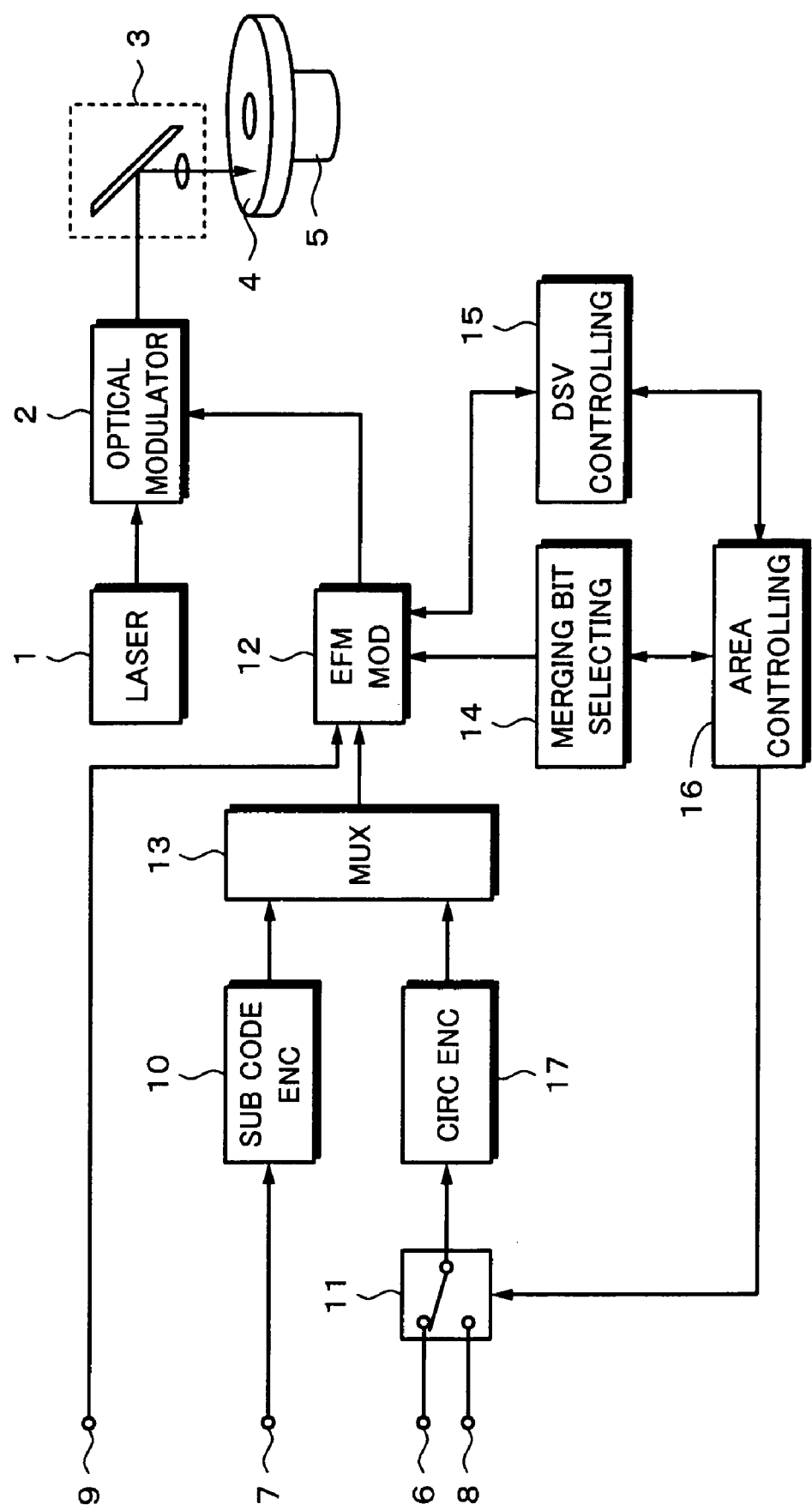
FIG. 1 is a block diagram showing an example of the structure of a mastering apparatus according to an embodiment of the present invention.

FIG. 1 shows an example of the structure of a mastering apparatus that produces a data recording medium according to the present invention. A data recording medium is for example an optical disc that accords with for example the CD (Compact Disc) standard. The mastering apparatus has a laser light source 1 that is a gas laser (for example, an Ar ion laser, an He-Cd laser, or a Kr ion laser) or a semiconductor laser, an acoustooptic effect type or electrooptic type optical modulator 2 that modulates laser light emitted from the laser light source 1, and an optical pickup 3 that has an objective lens that collects laser light that has passed through the optical modulator 2 and radiates the collected light to a photoresist surface of a disc shaped glass master disc 4 on which photoresist as a photosensitive material has been coated.

The optical modulator 2 modulates the laser light emitted from the laser light source 1 corresponding to a supplied record signal. The mastering apparatus radiates the modulated laser light to the glass master disc 4. As a result, a master on which data has been recorded is produced. In addition, the mastering apparatus has a servo portion (not shown). The servo portion performs a tracking control for controlling the relative positions of the optical pickup 3 and the master disc 4 and a rotation driving operation control of a spindle motor 5. The rotations of the glass master disc 4 are driven by the spindle motor 5 at for example constant linear velocity.

The record signal is supplied from an EFM modulator 12 to the optical modulator 2. Main digital data to be recorded is supplied from an input terminal 6. The main digital data is for example two-channel stereo digital audio data. Of course, the main digital data may be still picture data, video data, or CD-ROM data as well as digital audio data. The main digital data may be also digital audio data that has been compressed according to the MP3, the ATRAC, or the like. To protect data, the main digital data may be encrypted data.

A sub code of channels P to W according to the current CD standard is supplied from an input terminal 7. A frame sync is supplied to an input terminal 9.

In addition, special pattern data is supplied from an input terminal 8. In the special pattern, merging bits selected in the EFM modulation when DSV is controlled according to the relation of an immediately preceded code symbol and a code immediately followed thereby are different from merging bits selected in the EFM modulation when DSV is controlled according to the relation of that code symbol and a code symbol further immediately followed thereby. In reality, as shown in FIG. 2A and FIG. 2B, a special pattern is a pattern of which sub code data "00h (where h represents hexadecimal notation)" or "40h" is followed by a data symbol "90h", followed by data symbols "B9h" and "9Ah" that are alternately repeated in one frame. When the sub code data "00h" and "40h" are converted according to an EFM table, code symbols (01001000100000) and (01001000100100) are obtained, respectively. The low order two bits of these code symbols are (00), which is 2T or more. The EFM conversion table will be described later. It should be noted that the foregoing pattern is just an example.

The main digital data supplied from the input terminal 6 and the special pattern data supplied from the input terminal 8 are supplied to a CIRC (Cross Interleave Reed-Solomon Code) encoder 17 through a switch circuit 11. The switch circuit 11 is switched at a predetermined timing according to an output of an area controlling circuit 16 so as to place data of the special pattern at a predetermined position of the main digital data. The CIRC encoder 17 performs an error correction code encoding process for adding error correction parity data or the like and a scrambling process. In other words, 16 bits of one sample or one word are divided into two symbols that are high order eight bits and low order eight bits. In the unit of one symbol, the error correction code encoding process for adding for example CIRC error correction parity data or the like and the scrambling process are performed.

The sub code data supplied from the input terminal 7 is converted into sub code data having the EFM frame format of a sub code by a sub code encoder 10.

An output of the CIRC encoder 17 and an output of the sub code encoder 10 are supplied to a multiplexer 13. The multiplexer 13 arranges data that is output from the CIRC encoder 17 and the sub code encoder 10 in a predetermined order. Output data of the multiplexer 13 is supplied to the EFM modulator 12. The EFM modulator 12 converts a symbol of eight bits into data of 14 channel bits according to the conversion table. A frame sync is supplied to the EFM modulator 12.

In association with the EFM modulator 12, a merging bit selecting portion 14 and a DSV controlling portion 15 are disposed. The merging bit selecting portion 14 and the DSV controlling portion 15 select merging bits (000), (001), (010), or (100) that satisfies the run length limit conditions (Tmin=3T and Tmax=11T) and of which DSV approaches to "0". The merging bit selecting portion 14 and the DSV controlling portion 15 perform a merging bit selecting process according to not only the relation of an immediately preceded code symbol and a code immediately followed thereby, but also the relation of those symbols and a code symbol further immediately followed thereby that is pre-read.

An output of the EFM modulator 12 is supplied to the optical modulator 2. The EFM modulator 12 generates a record signal of the CD EFM frame format. The record signal is supplied to the optical modulator 2. With modulated laser light modulated by the optical modulator 2, photoresist on the glass master disc 4 is exposed. A developing process and an electroplating process are performed for the glass master disc 4 on which data has been recorded in such a manner. As a result, a metal master is produced. With the metal master, a mother disc is produced. With the mother disc, a stamper is produced. With the stamper, a substrate for an optical disc is produced by the compression molding method, the injection molding method, or the like. A reflection layer made of Al or the like is formed on the produced disc substrate. On the reflection layer, a protection layer is formed. As a result, an optical disc is produced.

Figure 3:
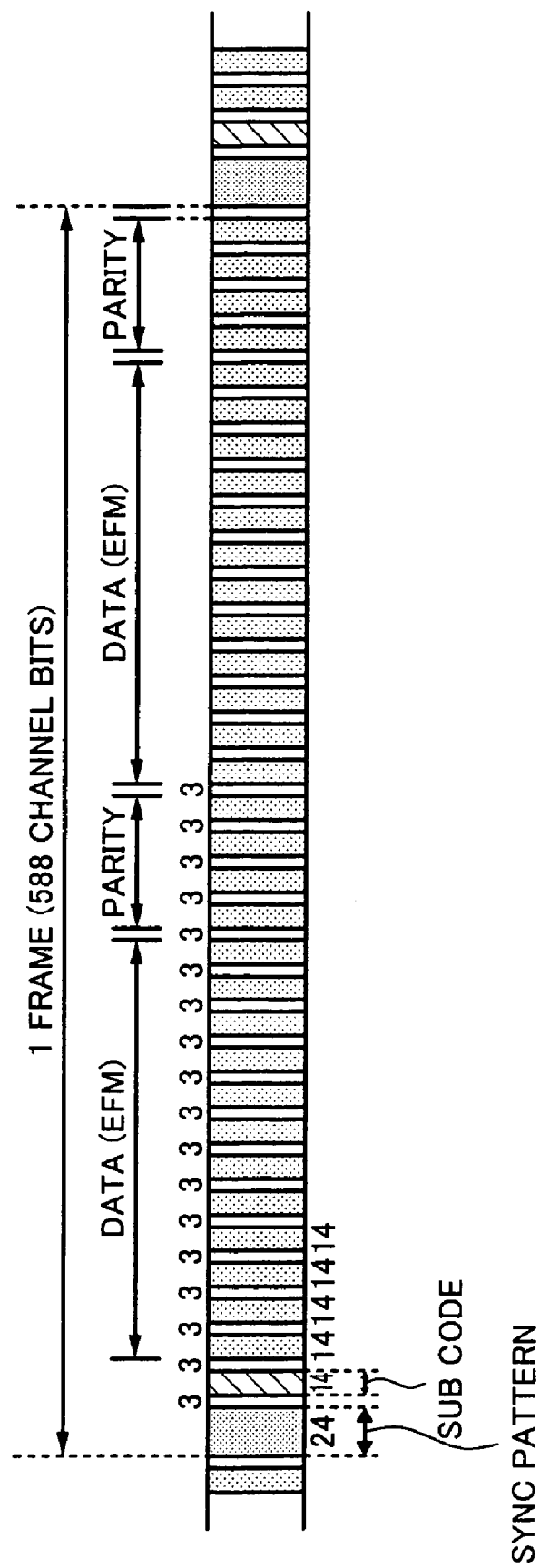
FIG. 3 is a schematic diagram describing the format of an EFM frame of a CD.

FIG. 3 shows the data structure of one EFM frame of the CD format. In the CD format, parity Q and parity P which are four symbols each are made from a total of 12 samples (24 symbols) of two-channel digital audio data. 33 symbols (264 data bits) of which one symbol of sub code data is added to a total of 32 symbols is treated as one block. In other words, one frame which has been EFM modulated contains sub code data of one symbol, data of 24 symbols, a Q parity of four symbols, and a P parity of four symbols.

In the EFM modulating system, each data symbol (eight data bits) is converted into a code symbol of 14 channel bits. Merging bits of three bits are placed between two code symbols of 14 channel bits each. In addition, a frame sync pattern is added at the beginning of a frame. When the period of a channel bit is T, a frame sync pattern is a pattern of which 11T, 11T, and 2T are in succession. Since such a pattern does not take place according to the EFM conversion rule, a frame sync can be detected with such a special pattern. The total number of bits of one EFM frame is 588 channel bits. The frame frequency is 7.35 kHz.

Figure 4:
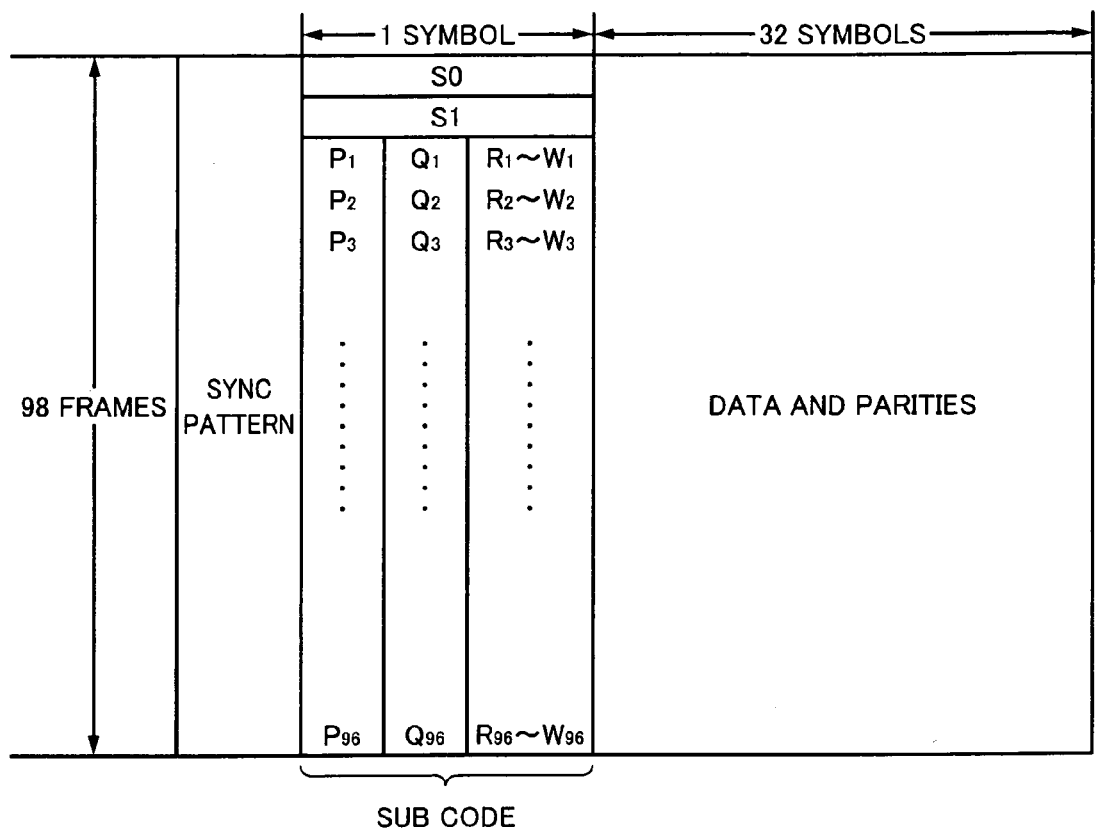
FIG. 4 is a schematic diagram describing a sub code block of a CD.

As shown in FIG. 4, a block of 98 EFM frames is referred to as sub code frame (or sub code frame). A sub code frame of which 98 frames are arranged in succession is composed of a sync pattern portion that identifies the beginning of the sub code frame, a sub code portion, and a data and parity portion. A sub code frame is equivalent to 1/75 second of a reproduction time of a conventional CD.

The sub code portion is composed of 98 EFM frames. Two frames at the beginning of the sub code portion are synchronous patterns S0 and S1 of the sub code frame and patterns of an EFM out-of-rule. The individual bits of the sub code portion compose P, Q, R, S, T, U, V, and W channels.

Although R channel to W channel may be used for special purposes such as a still picture or a sub-title display of so-called Karaoke, they are normally not used. P channel and Q channel are used for a track position controlling operation for the pickup during reproduction of digital data recorded on the disc.

P channel is used to record a signal whose level is "0" in a so-called lead-in area, which is an inner peripheral portion of the disc and a signal whose level alternately varies between "0" and "1" at predetermined periods in a so-called lead-out area, which is an outer peripheral portion of the disc. P channel is also used to record a signal whose level is "1" between music programs in a program area formed between the lead-in area and the lead-out area of the disc and a signal whose level is "0" in the other area. P channel is used to detect the beginning of each music program during reproduction of digital audio data recorded on the CD.

Figure 5:
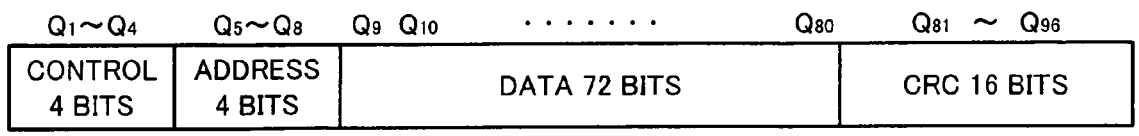
FIG. 5 is a schematic diagram describing Q channel of a sub code.

Q channel is provided to more acutely control digital audio data recorded on the CD during reproduction. One sub code frame of Q channel is composed of a control bit portion, an address bit portion, a data bit portion, and a CRC (Cyclic Redundancy Check) bit portion as shown in FIG. 5.

Thus, in the program area (except for an area between music programs), as shown in FIG. 6A and FIG. 6B, a data symbol in the sub code portion is "00h" or "40h". In other words, R to W channels are not used, whereas P channel and Q channel are used. In an area between music programs, P channel is "0". When data of Q channel is "0", as shown in FIG. 6A, a data symbol in the sub code portion is "00h". When data of Q channel is "1", as shown in FIG. 6B, a data symbol in the sub code portion is "40h".

According to the present embodiment, a special pattern is placed in such a manner that merging bits selected in the EFM modulation when DSV is controlled according to the relation of an immediately preceded code symbol and a code immediately followed thereby are different from merging bits selected in the EFM modulation when DSV is controlled according to the relation of that code symbol and a code symbol further immediately followed thereby. Next, such a special pattern will be described.

As described above, in the CD format, as a modulating system used to record data, the EFM modulation is used. In the EFM modulation, eight data bits (sometimes referred to as data symbol) are converted into 14 channel bits (sometimes referred to as code symbol). In addition, when 14-bit code symbols are connected, merging bits are placed therebetween so as to satisfy the run length limit conditions and keep DC balance.

FIG. 7 to FIG. 12 show an example of the EFM conversion table that converts data bits of eight bits into channel bits of 14 bits. In FIG. 7 to FIG. 12, data symbols are represented in hexadecimal notation (00 to FF), decimal notation (0 to 255), and binary notation (d1 . . . , d8). "1" of a code symbol represents that a waveform is inverted. The minimum time length of the EFM modulation (time length in which the number of 0s between two is of a record signal becomes the minimum) Tmin is 3T. The maximum time length of the EFM modulation (time length in which the number of 0s between two 1s of a record signal becomes the maximum) Tmax is 11T. The pit length equivalent to T is the shortest pit length. All code symbols shown in FIG. 7 to FIG. 12 satisfy rules of which the minimum time length is 3T and the maximum time length Tmax is 11T (hereinafter they are referred to as run length limit conditions).

Between two code symbols of 14 bits each, three merging bits are placed so as to satisfy the foregoing run length limit conditions and keep the DC balance. As merging bits, there are four types of patterns "000", "001", "010", and "100". Among the four patterns of merging bits, one pattern that satisfies the run length limit conditions of which the minimum time length Tmin is 3T and the maximum time length is 11T and of which DSV (Digital Sum Variation) is close to "0" is selected.

Next, an example of which merging bits are used to connect code symbols of 14 bits each will be described with reference to FIG. 13A to FIG. 13D. The following example is described in "Book on Compact Disc (Version 3) [translated title; written in Japanese]", published by Ohm-Sha Publishing Company, Japan, Mar. 25, 2001.

As shown in FIG. 13A, the cast that a preceded pattern of 14 bits ends with "010" and a data symbol immediately followed thereby is "01110111" ("77h" in hexadecimal notation and "119" in decimal notation) will be considered. The data symbol is converted into a code symbol of 14 bits (00100010000010) according to the conversion table shown in FIG. 7 to FIG. 12. In FIG. 13A to FIG. 13D, before timing t0, the code symbol of 14 bits ends. At timing $t_1$ after the period of merging bits, the immediately followed code symbol of 14 bits starts. At timing $t_2$, the further followed pattern of 14 bits starts. The waveform is inverted at "1".

When the preceded pattern of 14 bits ends with (010) and the immediately followed code symbol of 14 bits is converted into (00100010000010), if the merging bits (100) of the foregoing four patterns are used, the condition of Tmin=3T is not satisfied. Thus, the merging bits (100) cannot be used. From the rest of patterns of the merging bits (000), (010), and (001), one pattern that decrease DSV is selected.

DSV is a cumulative value of which when a waveform is in a high level, "+1" is counted and when a waveform is in a low level, "−1" is counted. As an example, it is assumed that DSV at timing to is (−3).

FIG. 13B shows the case that "000" are used as merging bits. FIG. 13C shows the case that "010" are used as merging bits. FIG. 13D shows the case that "001" are used as merging bits.

As shown in FIG. 13B, when (000) are used as merging bits, DSV is "−3" at timing t0. DSV is "+3" in period (t0 to t1). DSV is "+2" (+2−4+6−2=+2) in period (t1 to t2). Thus, DSV is (−3+3+2=+2) at timing t2.

As shown in FIG. 13C, when (010) are used as merging bits, DSV is "−3" at timing t0. DSV is "−1" (+1−2=−1) in period (t0 to t1). DSV is "−2" (−2+4−6+2=−2) in period (t1 to t2). Thus, DSV is (−3−1−2=−2) at timing t2.

As shown in FIG. 13D, when (001) are used as merging bits, DSV is "−3" at timing t0. DSV is "+1" (+2−1=1) in period (t0 to t1). DSV is "−2" (−2+4−6+2=−2) in period (t1 to t2). Thus, DSV is (−3+1−2=−4) at timing t2.

Thus, when the preceded pattern of 14 bits ends with (010) and the immediately followed code symbol of 14 bits is converted into (00100010000010), merging bits that satisfy the run length limit conditions (Tmin=3T and Tmax=11T) are (000), (010), and (001). When (000) are used as merging bits, DSV becomes "+2". When (010) are used as merging bits, DSV becomes "−6". When (001) are used as merging bits, DSV becomes "−4". Thus, merging bits (000) of which DSV becomes closest to "0" at timing t2 are selected as merging bits in period (t0 to t1).

Thus, when code symbols of 14 bits each are connected, merging bits are selected from four patterns of (000), (001), (010), and (100) that satisfy the rules (Tmin=3T and Tmax=11T) and of which the cumulative value of DSV approaches to "0". As a result, the run length limit conditions (Tmin=3T and Tmax 11T) can be satisfied. In addition, DSV converges to "0". In such a manner, in the EFM, when merging bits are properly selected, DSV can be caused to converge to "0". When DSV converges to "0", the DC balance is kept. When the DC balance is not kept, the slice level in which data is reproduced goes wrong. As a result, an error increases and the spindle servo gets disordered. Substantially, the reproducing operation cannot be performed.

However, even if merging bits are selected, DSV does not always converge to "0" in every pattern. In other words, in some special patterns, DSV does not converge to "0".

Figures 14A, 14B, 14C:
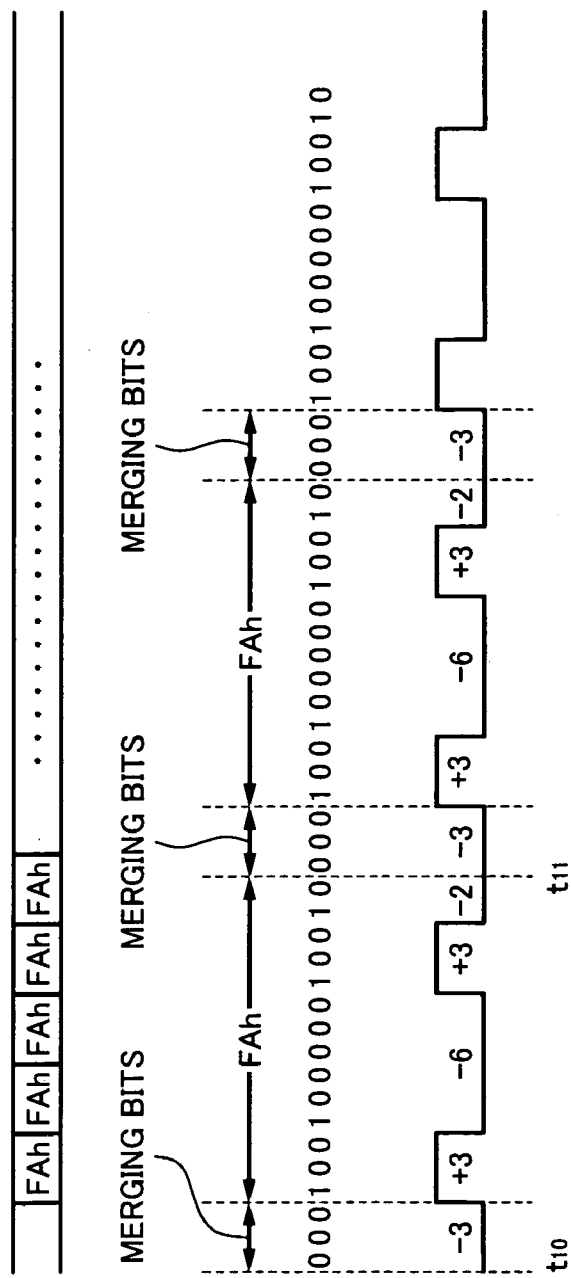
FIG. 14A, FIG. 14B, and FIG. 14C are schematic diagrams showing an example of a special pattern of which DSV does not converge.

For example, a pattern of which data symbols "FAh" are repeated as shown in FIG. 14A is considered. When a data symbol "FAh" is converted into a code symbol of 14 bits according to the foregoing conversion table, a code symbol (10010000010010) is obtained. As merging bits that connect code symbols (10010000010010), into which data symbols "FAh" have been converted, as shown in FIG. 14B, (000) are unconditionally used. This is because other merging bits ((001), (010), and (100)) do not satisfy the run length limit condition Tmin=3T.

FIG. 14C shows a waveform of the pattern shown in FIG. 14B. As is clear from FIG. 14C, in the pattern, DSV negatively increases by "−5" (−3+3−6+3−2=−5) in period (t10 to f11). Thus, in a pattern of which data symbols "FAh" are repeated, DSV negatively increases, not converges to "0".

Figures 15A, 15B, 15C:
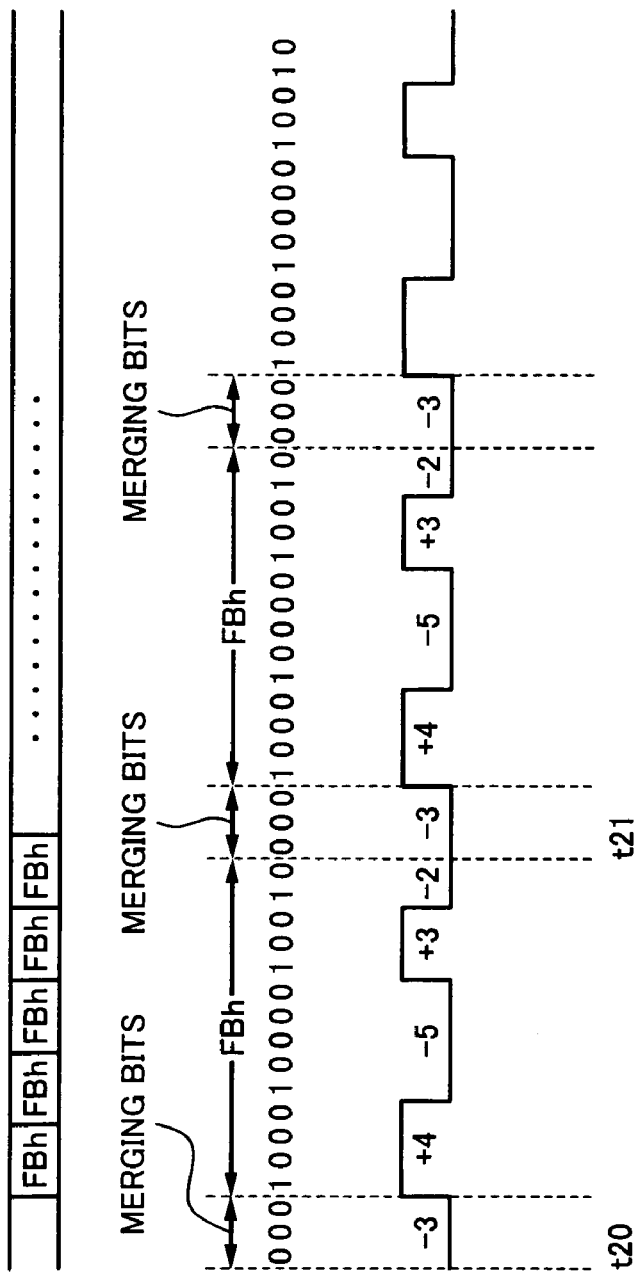
FIG. 15A, FIG. 15B, and FIG. 15C are schematic diagrams showing another example of a special pattern of which DSV does not converge.

Next, a pattern of which data symbols "FBh" are repeated as shown in FIG. 15A is considered. When a data symbol "FBh" is converted into a code symbol of 14 bits according to the foregoing conversion table, a code symbol (10001000010010) is obtained. As merging bits that connect code symbols (10001000010010), into which data symbols "FBh" have been converted, due to the run length limit conditions (Tmin=3T and Tmax=11T), (000) are unconditionally selected as shown in FIG. 15B.

FIG. 15C shows a waveform of the pattern shown in FIG. 15B. As is clear from FIG. 15C, when code symbols (10001000010010) of 14 channel bits each, into which data symbols "FBh" have been converted, are connected with merging bits (000), DSV negatively increases by (−3+4−5+3−2=−3) in period (t20 to t21). Thus, in a pattern of which data symbols "FBh" are repeated, DSV negatively increases, not converges to "0".

Figures 16A, 16B, 16C:
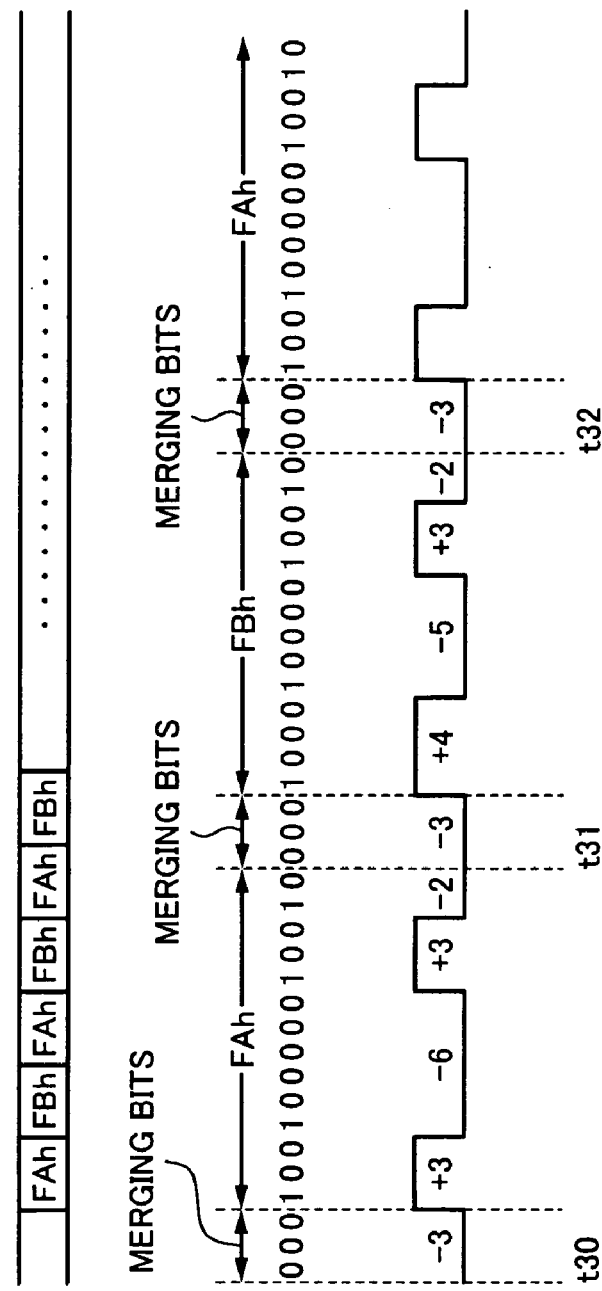
FIG. 16A, FIG. 16B, and FIG. 16C are schematic diagrams showing a further example of a special pattern of which DSV does not converge.

As shown in FIG. 16A, a pattern of which data symbols "FAh" and "FBh" are alternately repeated. When a data symbol "FAh" is converted into a code symbol of 14 bits according to the foregoing conversion table, a code symbol (10010000010010) is obtained. When a data symbol "FBh" is converted into a code symbol of 14 bits according to the foregoing conversion table, a code symbol (10001000010010) is obtained. As merging bits that connect the code symbol (10010000010010), into which the data symbol "FAh" has been converted, and the code symbol (10001000010010), into which the data symbol "FBh" has been converted, due to the run length limit condition (Tmin=3T), (000) are unconditionally selected as shown in FIG. 16B.

FIG. 16C shows a waveform of the pattern shown in FIG. 16B. As is clear from FIG. 16C, when the code symbol (10010000010010), into which the data symbol "FAh" has been converted, and the code symbol (10001000010010), into which the data symbol "FBh" has been converted, are connected with the merging bits (000), as the waveform shown in FIG. 16C, DSV negatively increases by "−5" (−3+3−6+3−2=−5) in period (t30 to t31). DSV negatively increases by "−3" (−3+4−5+3−2=−3) in period (t31 to t32). Thus, in a pattern of which "FAh" and "FBh" are alternately repeated, DSV negatively increases, not converges to "0".

Thus, in the foregoing special patterns, merging bits cannot be selected. Consequently, using flexibility of merging bits, the function for causing DSV to converge to "0" does not work. As long as such a data pattern continues, DSV positively or negatively continues to increase. Unless DSV converges to "0", the DC balance is lost, an error increases, and the servo gets disordered. Substantially, the reproducing operation for the disc cannot be performed.

It is clear that special patterns of which DSV does not converge to "0" are not limited to the foregoing examples. For example, when a converted code symbol of 14 bits that ends with "0T" or "1T" and a converted code symbol of 14 bits that begins with "0T" or "11T" are connected, merging bits cannot be selected. Thus, there is a possibility of which DSV does not converge to "0".

As described above, as merging bits that connect code symbols of 14 bits each, merging bits are selected from (000), (100), (010), and (001) that satisfy the run length limit conditions (Tmin=3T and Tmax=11T) and of which DSV approaches to "0". Merging bits are selected so that they satisfy the run length limit conditions (Tmin=3T and Tmax=11T) and the cumulative value of DSV approaches to "0".

However, there is a special pattern of which when merging bits are selected according to the relation of an immediately preceded code symbol and a code symbol immediately followed thereby so that DSV approaches to "0", DSV increases according to the relation of those code symbol and a code symbol further immediately followed thereby. In other words, there is a special pattern of which merging bits selected in the EFM modulation when DSV is controlled according to the relation of an immediately preceded code symbol and a code symbol immediately followed thereby is different from merging bits selected in the EFM modulation when DSV is controlled according to the relation of those symbols and a code symbol further immediately followed thereby. In such a special pattern, it is necessary to select merging bits according to not only the relation of an immediately preceded code symbol and a code symbol immediately followed thereby, but also the relation of those code symbol and a code symbol further immediately followed thereby.

Next, a pattern of which a data symbol "90h" is followed by data symbols "B9h" and "9Ah" that are alternately repeated is considered.

Figures 17A, 17B, 17C, 17D, 17E:
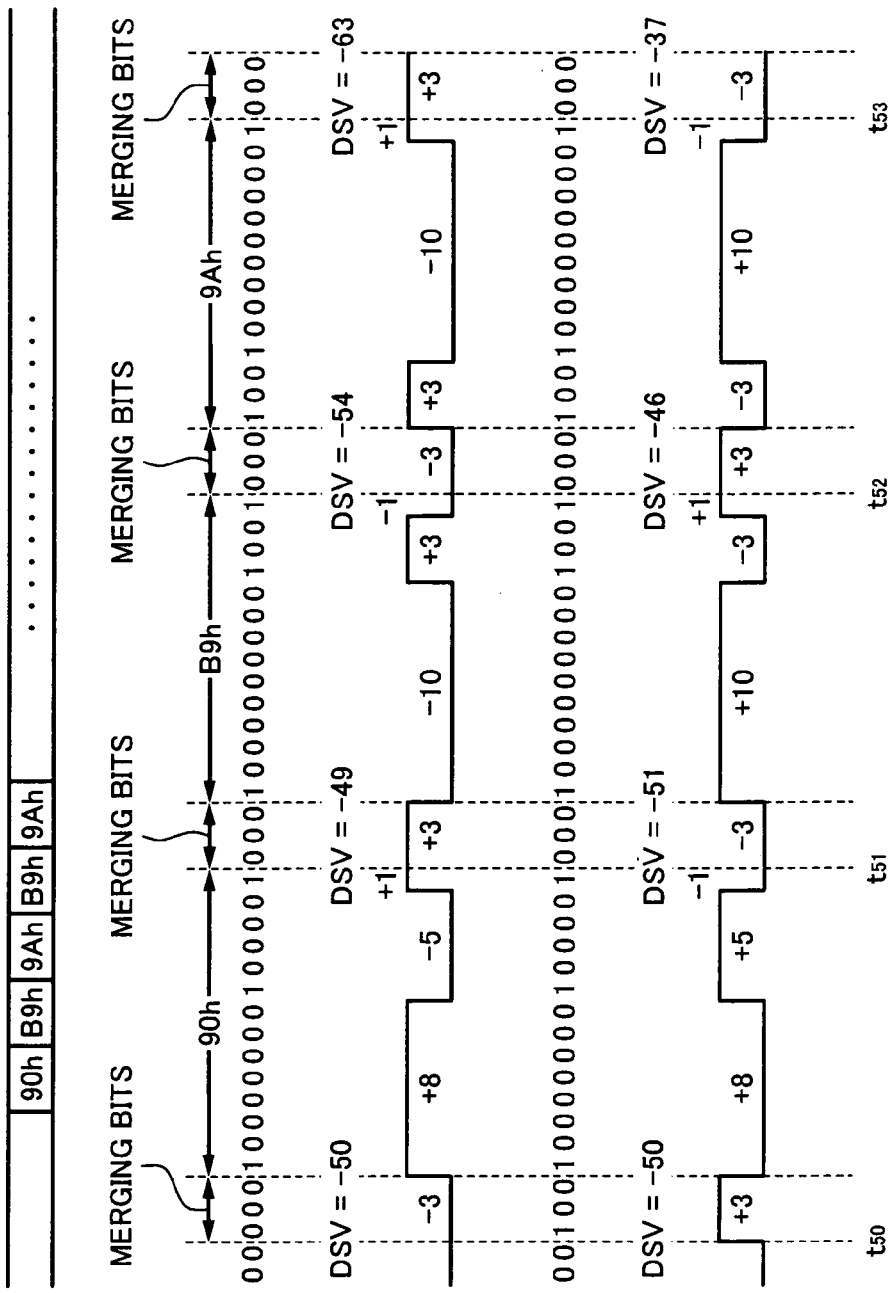
FIG. 17A to FIG. 17E are schematic diagrams showing an example of a special pattern of which DSV does not converge in the EFM modulation when DSV is controlled according to only the relation of an immediately preceded code symbol and a code symbol immediately followed thereby.

When a data symbol "90h" is converted into a code symbol of 14 bits according to the foregoing conversion table, a code symbol of 14 bits (10000000100001) is obtained. When the immediately preceded code symbol ends with "00", (the sub code is "00h" or "40h" and the code symbol thereof ends with "00"), merging bits that immediately precede the code data (10000000100001) are (000) or (100) due to the run length limit conditions (Tmin=3T and Tmax=11T). The merging bits (000) or (100) are selected depending on DSV. FIG. 17B and FIG. 17C show the case that merging bits (000) have been selected. FIG. 17D and FIG. 17E show the case that (100) are selected as merging bits.

In FIG. 17A to FIG. 17E, it is assumed that the cumulative value of DSV is (−50) until timing t50. As shown in FIG. 17B, when (000) are selected as merging bits, DSV varies by "+1" (−3+8−5+1=+1) in period (t50 to t51). DSV is (−49) at timing t51.

In contrast, as shown in FIG. 17D, when (100) are selected as merging bits, DSV varies by "−1" (+3−8+5−1=−1) in period (t50 to t51). DSV is "−51" at timing t51.

Thus, when (000) are selected as merging bits, DSV is "−49" at timing t51. When (100) are selected as merging bits, DSV is "−51" at timing t51. Thus, normally, (000) are selected as merging bits.

Figure 18:
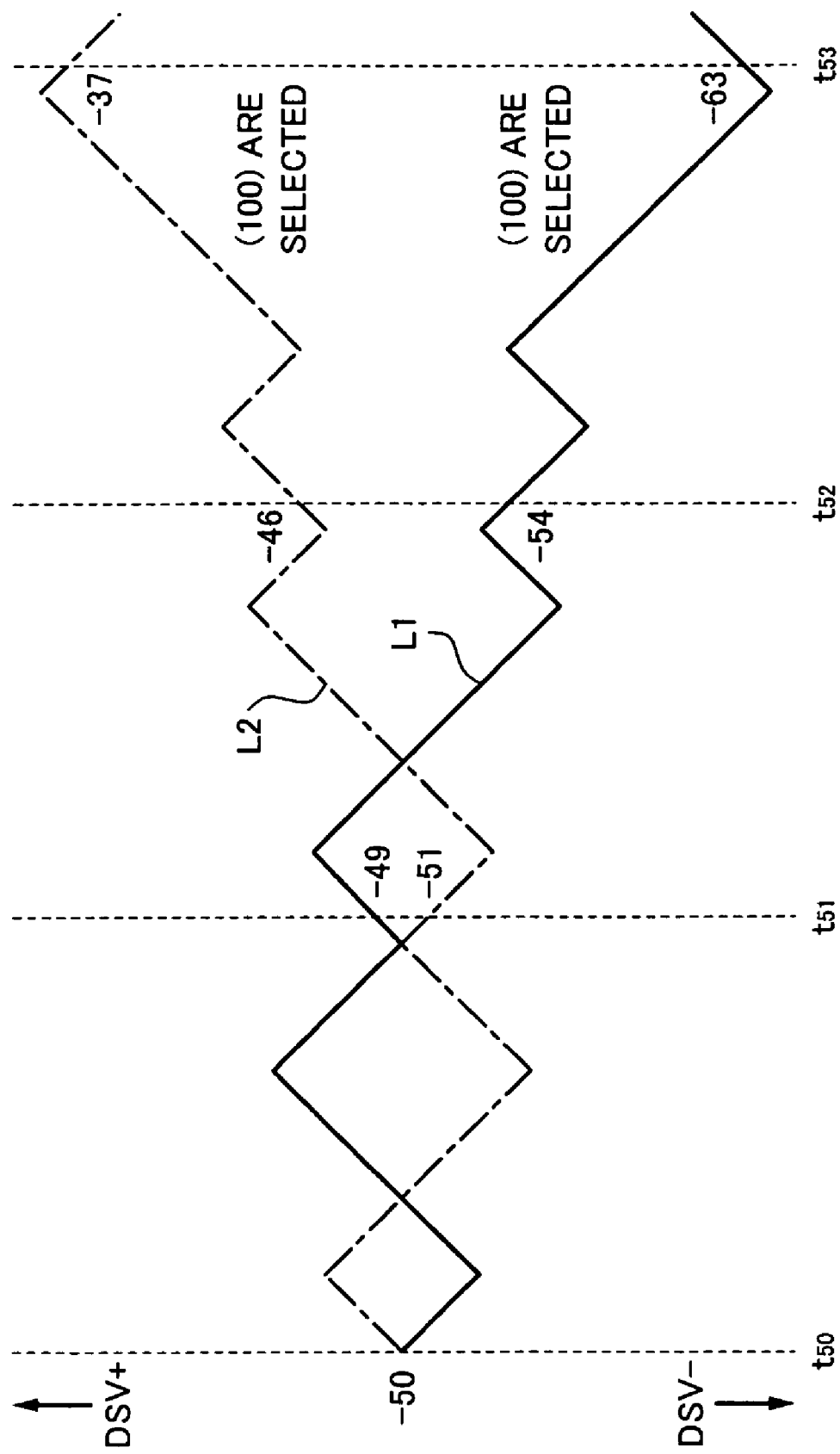
FIG. 18 is a schematic diagram describing an example of a special pattern of which DSV does not converge in the EFM modulation when DSV is controlled according to only the relation of an immediately preceded code symbol and a code symbol immediately followed thereby.

However, in such a pattern, when (000) are selected as merging bits, as denoted by broken line L1 of FIG. 18, DSV negatively increases. Thus, DSV does not converge to "0". On the other hand, when (100) are selected as merging bits, as denoted by broken line L2 of FIG. 18, DSV converges to "0".

In other words, when (000) are selected as merging bits, thereafter, the waveform varies as shown in FIG. 17C.

As shown in FIG. 17A to FIG. 17E, a data symbol "90h" is followed by a data symbol "B9h". When the data symbol "B9h" is converted into a code symbol of 14 bits according to the foregoing conversion table, a code symbol "10000000001001" is obtained. As merging bits placed between the code data (10000000100001), into which the data symbol "90h" has been converted, and the code data (10000000001001), into which the data symbol "B9h" has been converted, due to the run length limit conditions (Tmin=3T and Tmax=11T), merging bits (000) are unconditionally selected. When (000) are selected as merging bits, DSV varies by "−5" (+3−10+3−5=−5) in period (t51 to t52). DSV is "−54" at timing t52.

The data symbol "B9h" is followed by a data symbol "9Ah". When the data symbol "9Ah" is converted into a code symbol of 14 bits according to the foregoing code symbol, a code symbol (10010000000001) is obtained. As merging bits placed between the code data (10000000001001), into which the data symbol "B9h" has been converted, and the code symbol (10010000000001), into which the data symbol "9Ah" has been converted, due to the run length limit conditions (Tmin=3T and Tmax=11T), (000) are unconditionally selected. When (000) are selected as merging bits, DSV varies by "−9" (−3+3−10+1=−9) in period (t52 to t53). DSV is "−63" at timing t53.

Thereafter, DSV varies by "−5" in the period of the data symbol "B9h". DSV varies by "−9" in the period of the data symbol "9Ah". DSV varies as denoted by broken line L1 of FIG. 18. Thereafter, since the data symbols "9Ah" and "B9h" are alternately repeated, DSV negatively increases. Thus, DSV does not converge to "0".

In contrast, FIG. 17E shows a waveform in the case that (100) are selected as the first merging bits.

As shown in FIG. 17A to FIG. 17E, the data symbol "90h" is followed by the data symbol "B9h". When the data symbol "B9h" is converted into a code symbol of 14 bits, a code symbol (10000000001001) is obtained. As merging bits placed between the code data (10000000100001), into which the data symbol "90h" has been converted, and the code data (10000000001001), into which the data symbol "B9h" has been converted, due to the run length limit conditions (Tmin=3T and Tmax=11T), (000) are unconditionally selected. When (000) are selected as merging bits, DSV varies by "+5" (−3+10−3+1=+5) in period (t51 to t52). DSV is "−46" at timing t52.

The data symbol "B9h" is followed by the data symbol "9Ah". When the data symbol "9Ah" is converted into a code symbol of 14 bits, a code symbol (10010000000001) is obtained. As merging bits placed between the code data (10000000001001), into which the data symbol "B9h" has been converted, and the code data (10010000000001), into which the data symbol "9Ah" has been converted, due to the run length limit conditions (Tmin=3T and Tmax=11T), (000) are unconditionally selected. When (000) are selected as the merging bits, DSV varies by "+9" (+3−3+10−1=+9) in period (t52 to t53). DSV is "−37" at timing t53.

Thereafter, DSV varies by "+5" in the period of the data symbol "B9h". DSV varies by "+9" in the period of the data symbol "9Ah". DSV varies as denoted by broken line L2 of FIG. 18. Thus, thereafter, the data symbol "9Ah" and the data symbol "B9h" are alternately repeated. As a result, DSV positively increases. As denoted by broken line L2 of FIG. 18, DSV converges to "0".

In such a special pattern, when merging bits are selected so that DSV approaches to "0" according to the relation of an immediately preceded code symbol and a code symbol immediately followed thereby, thereafter, DSV positively or negatively increases. In such a pattern, it is necessary to select merging bits according to not only the relation of an immediately preceded code symbol and a code symbol immediately followed thereby, but also the relation of that code symbol and a code symbol further immediately followed thereby. Such a pattern is not limited to the foregoing example.

In the foregoing example, merging bits of which DSV approaches to "0" according to the relation of an immediately preceded code symbol and a code symbol immediately followed thereby are different from merging bits of which DSV approaches to "0" according to the relation of that code symbol and a code symbol further immediately followed thereby. However, according to the present invention, a special pattern of which merging bits or a conversion pattern selected when DSV is calculated according to the relation of one code symbol and A code symbols immediately followed thereby is different from merging bits or a conversion pattern selected when DSV is calculated according to the relation of one code symbol and B (where B >A) code symbols immediately followed thereby can be used. The predetermined number A is normally "1".

As described above, in the EFM modulation, using the flexibility of merging bits, DSV is caused to converge to "0". However, it is clear that in a special pattern merging bits are unconditionally selected and DSV cannot be caused to converge to "0".

It is clear that in a special pattern merging bits selected in the EFM modulation when DSV is controlled according to the relation of an immediately preceded code symbol and a code symbol immediately followed thereby are different from merging bits selected in the EFM modulation when DSV is controlled according to the relation of that code symbol and a code symbol further immediately followed thereby.

In the case that such a special pattern is contained in an original disc, when data is reproduced from the original disc, the reproduced data is encoded by a conventional encoder, and the encoded data is recorded on a recording medium such as a CD-R disc, then a recording medium of which DSV does not converge to "0" is produced. As a result, the reproduced data would not been correctly read from the medium.

In the example, as described above, a special pattern of which merging bits selected in the EFM modulation when DSV is controlled according to the relation of an immediately preceded code symbol and a code symbol immediately followed thereby are different from merging bits selected in the EFM modulation when DSV is controlled according to the relation of that code symbol and a code symbol further immediately followed thereby is used.

In other words, in the master apparatus shown in FIG. 1, which produces an original CD, the EFM modulator 12, the merging bit selecting portion 14, and the DSV controlling portion 15 select merging bits according to not only the relation of an immediately preceded code symbol and a code symbol immediately followed thereby, but also the relation of that code symbol and a code symbol further immediately followed thereby that is pre-read. Thus, even if an original recording medium produced by the master apparatus contains a special pattern shown in FIG. 2A, FIG. 2B, or FIG. 17A to FIG. 17E, merging bits are selected so that DSV converges to "0". In contrast, when data of an original recording medium is copied to a CD-R disc or the like, the EFM modulating portion selects merging bits of which DSV approaches to "0" according to the relation of only an immediately preceded code symbol and a code symbol immediately followed thereby not the relation of that code symbol and a code symbol further immediately followed thereby that is pre-read. Thus, when a special pattern shown in FIG. 2A, FIG. 2B, or FIG. 17A to FIG. 17E is reproduced from a copied recording medium, since DSV increases, the reproducing operation cannot be performed.

Figure 19:
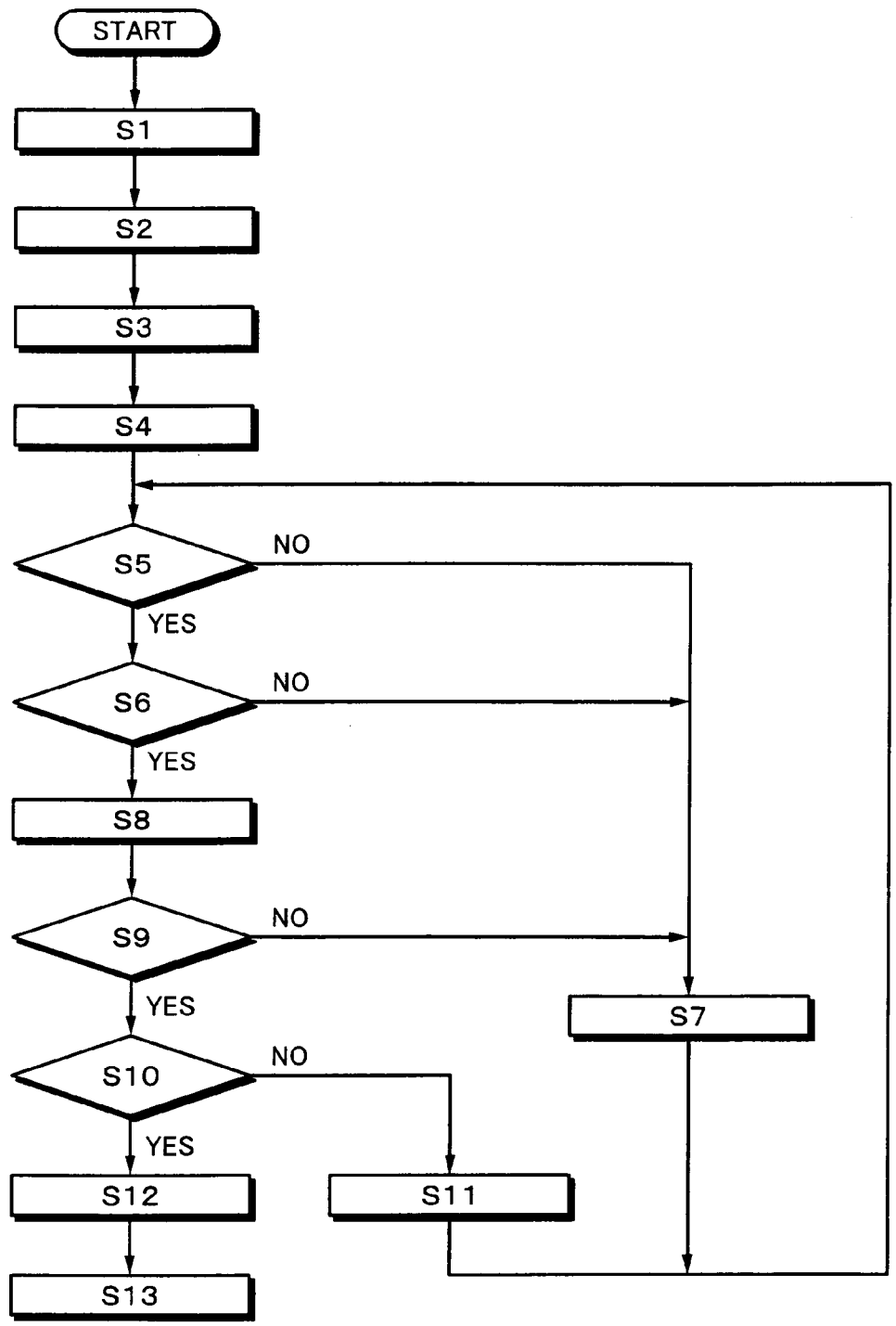
FIG. 19 is a flow chart describing a merging bit selecting process performed by a modulator according to the present invention.

FIG. 19 is a flow chart showing an example of a process for selecting merging bits according to not only the relation of an immediately preceded code symbol and a code symbol immediately followed thereby, but also the relation of that code symbol and a code symbol further immediately followed thereby that is pre-read as with the EFM modulator 12, the merging bit selecting portion 14, and the DSV controlling portion 15 of the mastering apparatus shown in FIG. 1.

As shown in FIG. 20A, an immediately preceded data symbol of eight bits is denoted by D0, a current data symbol of eight bits is denoted by D1, a data symbol of eight bits immediately followed thereby is denoted by D2, and data symbols further immediately followed thereby are denoted by D3, D4, . . . , and so forth.

As shown in FIG. 20B, these data symbols D0, D1, D2, D3, D4, . . . and so forth are converted into code symbols of 14 bits each. The converted code symbols are denoted by d0, d1, d2, d3, . . . , and so forth. The position of merging bits placed between the code symbol d0 and the code symbol d1 is denoted by (A=1). The position of merging bits placed between the code symbol d1 and the code symbol d2 is denoted by (A=2). Alternatives of four patterns of merging bits of (A=1) are denoted by MPn (1) ((MP0 (1)=000), (MP1 (1)=001), (MP2 (1)=010), and (MP3 (1)=100). Alternatives of four patterns of merging bits of (A=2) are denoted by MPn (2) ((MP0 (2)=000), (MP1 (2)=001), (MP2 (2)=010), and (MP3 (2)=100)).

In FIG. 19, when merging bits placed between the code symbol d0 and the code symbol d1 immediately followed thereby are selected, the data symbol D1 of eight bits and the data symbol D2 immediately followed thereby are input (at step S1). The data symbols D1 and D2 are converted into code symbols d1 and d2 of 14 bits each according to the conversion table (at step S22). Alternative merging bits placed between the code symbol d0 and the code symbol d1 (A1) and alternative merging bits placed between the code symbol d1 and the code symbol d2 (A2) are selected (at step S3).

First of all, (A=1), (n (1)=0) are set. With merging bits MP0 (1) (MP0 (1)=000), the code symbol do and the code symbol d1 (at position A=1) are tried to be connected (at step S4). With the merging bits MP0 (1), the code symbol d0 and the code symbol d1 are tried to be connected and it is determined whether or not the run length limit condition of the minimum inversion period (Tmin=3T) is satisfied (at step S5). When the condition of the minimum inversion period (Tmin=3T) is satisfied, it is determined whether or not the run length limit condition of the maximum inversion period (Tmax=11T) is satisfied (at step S6).

When the condition of the minimum inversion period (Tmin=3T) is not satisfied at step S5 or when the condition of the maximum inversion period (Tmax=11T) is not satisfied at step S6, n (1) is incremented (at step S7). With the merging bits MPn+1 (1), the code symbol d0 and the code symbol d1 are tried to be connected (A=1) and it is determined whether or not the run length limit condition of the minimum inversion period (Tmin=3T) is satisfied (at step S5). When the condition of the minimum inversion period (Tmin=3T) is satisfied, it is determined whether or not the run length limit condition of the maximum inversion period (Tmax=11T) is satisfied (at step S6).

When the condition of the minimum inversion period (Tmin=3T) is satisfied at step S5 and when the condition of the maximum inversion period (Tmax=11T) is satisfied at step S6, as merging bits that satisfy the run length limit conditions of (A=1), the information is stored (at step S8). Thereafter, it is determined whether or not (n (1)=3) is satisfied (at step S9). When (n (1)=3) is not satisfied, n (1) is incremented (at step S7). With the merging bits MPn+1 (1), the code symbol d0 and the code symbol d1 are tried to be connected (A=1) and it is determined whether or not the run length limit condition of the minimum inversion period (Tmin=3T) is satisfied (at step S5). When the condition of the minimum inversion period (Tmin=3T) is satisfied, it is determined whether or not the run length limit condition of the maximum inversion period (Tmax=11T) is satisfied (at step S6).

By repeating the foregoing process, with the merging bits MP0 (1) (MP0 (1)=000), MP1 (1) (MP1 (1)=001), MP2 (1) (MP2 (1)=010), MP3 (1) (MP3 (1)=100), the code symbol d0 and the code symbol d1 are connected (A=1) and it is determined whether or not the run length limit conditions of the minimum inversion period (Tmin=3T) and the maximum inversion period (Tmax=11T) are satisfied. The information of merging bits that satisfy the run length limit conditions is stored at step S8.

When the determined result at step S9 represents that (n (1)=3) is satisfied, it is determined whether or not (A=2) is satisfied (at step S10). When (A=2) is not satisfied, A is incremented (at step S11). Thereafter, the flow returns to step S5.

Thereafter, (A=2), (n (2)=0) are set. With the merging bits MPO (2) (MPO (2)=000), the code symbol d1 and the code symbol d2 are tried to be connected (A=2). With the merging bits MP0 (2), the code symbol d1 and the code symbol d2 are tried to be connected and it is determined whether or not the run length limit condition of the minimum inversion period (Tmin=3T) is satisfied (at step S5). When the condition of the minimum inversion period (Tmin=3T) is satisfied, it is determined whether or not the run length limit condition of the maximum inversion period (Tmax=11T) is satisfied (at step S6).

When the condition of the minimum inversion period (Tmin=3T) is not satisfied at step S5 or when the condition of the maximum inversion period (Tmax=11T) is not satisfied at step S6, n (2) is incremented (at step S7). With the merging bits Mpn+1 (2), the code symbol d1 and the code symbol d2 are tried to be connected (A=2) and it is determined whether or not the run length limit conditions of the minimum inversion period (Tmm=3T) is satisfied (at step S5). When the condition of the minimum inversion period (Tmin=3T) is satisfied, it is determined whether or not the run length limit condition of the maximum inversion period (Tmax=11T) is satisfied (at step S6).

When the condition of the minimum inversion period (Tmin=3T) is satisfied at step S5 and when the condition of the maximum inversion period (Tmax=11T) is satisfied at step S6, as merging bits that satisfy the run length limit conditions of (A=2), this information is stored (at step S8). Thereafter, it is determined whether or not (n (2)=3) is satisfied (at step S9). When (n (2)=3) is not satisfied, n (2) is incremented (at step S7). With the merging bits MPn+1 (2), the code symbol d1 and the code symbol d2 are tried to be connected (A=2) and it is determined whether or not the run length limit condition of the minimum inversion period (Tmin=3T) is satisfied (at step S5). When the condition of the minimum inversion period (Tmin=3T) is satisfied, it is determined whether or not the run length limit condition of the maximum inversion period (Tmax=11T) is satisfied (at step S6).

By repeating the foregoing process, with the merging bits MP0 (2) (MP0(2)=000), MP1 (2) (MP1 (2)=001), MP2 (2) (MP2 (2)=010), MP3 (2) (MP3 (2)=100), the code symbol d1 and the code symbol d2 are connected (A=2) and it is determined whether or not the run length limit conditions of the minimum inversion period (Tmin=3T) and the maximum inversion period (Tmax=11T) are satisfied. The information of the merging bits that satisfy the run length conditions is stored at step S8.

When the determined result at step S9 represents that (n (2)=3) is satisfied, it is determined whether or not (A=2) is satisfied (at step S9). When (A=2) is satisfied, with a combination of the merging bit information that satisfies the run length limit conditions of the minimum inversion period (Tmin=3T) and the maximum inversion period (Tmax=11T) at the position (A=1) stored at step S8 and the merging bit information that satisfies the run length limit conditions of the minimum inversion period (Tmin=3T) and the maximum inversion period (Tmax=11T), DSV is calculated. In other words, in a combination of the merging bits MPn (1) that satisfy the conditions and that are placed between the immediately preceded code symbol do and the current code symbol d1 (A=1) and the merging bits MPn (2) that satisfy the conditions and that are placed between the current code symbol d1 and the code symbol d2 immediately followed thereby (A=2), DSV is obtained. In the combination, the minimum value of the absolute values of DSV is selected (at step S12). Thus, merging bits placed between the code symbol d0 and the current code symbol d1 (A=1) are decided (at step S13).

In the example, merging bits placed between the code symbol d0 and the code symbol d1 immediately followed thereby (A=1) are decided by pre-reading the code symbol D2 further immediately followed thereby, converting the code symbol D2 into the code symbol d2, and considering merging bits selected between the code symbol d1 and the code symbol d2 (A=2). In addition, to decide the merging bits, the data symbols D3, D4, . . . and so forth may be pre-read.

Figure 21:
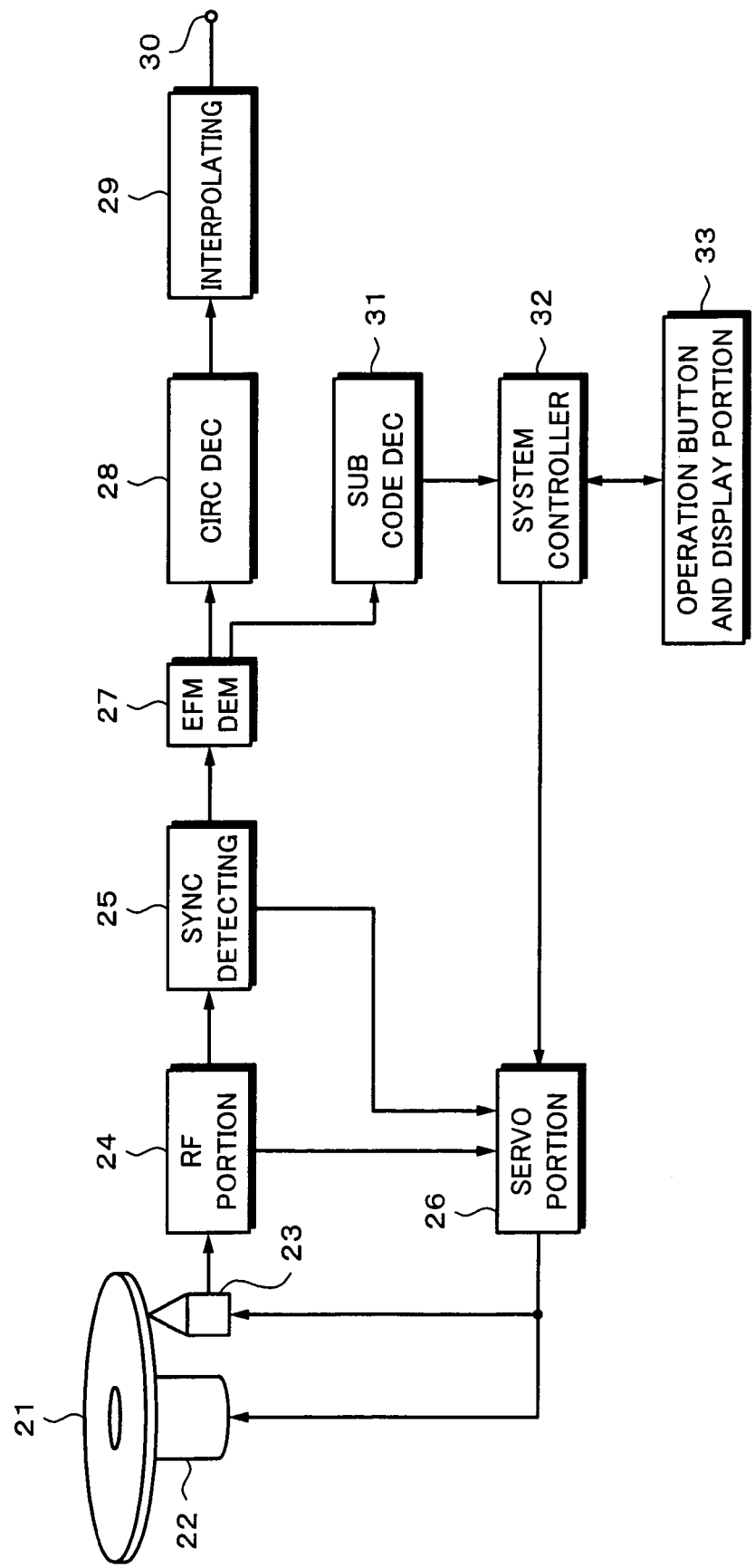
FIG. 21 is a block diagram showing an example of a CD reproducing apparatus.

FIG. 21 shows an example of the structure of a reproducing apparatus that reproduces data from an optical disc that has been produced in the foregoing mastering and stamping processes.

Although the structure of the reproducing apparatus is the same as that of a conventional player or drive, the structure will be described for easy understanding of the present invention. In FIG. 21, reference numeral 21 represents a disc as a recording medium produced in the foregoing mastering and stamping processes. Reference numeral 22 represents a spindle motor that drives the rotations of the disc 21. Reference numeral 23 represents an optical pickup that reproduces a signal from the disc 21. The optical pickup 23 is composed of a semiconductor laser that radiates laser light to the disc 21, an optical system such as an objective lens, a detector that receives light reflected from the disc 21, a focus and tracking mechanism, and so forth. The optical pickup 23 is traveled in the radius direction of the disc 21 by a thread mechanism (not shown).

Output signals of for example a four-divided detector of the optical pickup 23 are supplied to an RF portion 24. The RF portion 24 calculates the output signals of the individual detector elements of the four-divided detector and generates a reproduction (RF) signal, a focus error signal, and a tracking error signal. The reproduction signal is supplied to a sync detecting portion 25. The sync detecting portion 25 detects a frame sync from the beginning of each EFM frame. The detected frame sync, the focus error signal, and the tracking error signal are supplied to a servo portion 26. The servo portion 26 controls the rotations of the spindle motor 22 and performs a focus servo and a tracking servo of the optical pickup 23 corresponding to a reproduced clock of the RF signal.

Main data that is output from the sync detecting portion 25 is supplied to an EFM demodulator 27. The EFM demodulator 27 performs an EFM demodulating process for the main data. Main digital data is supplied from the EFM demodulator 27 to a CIRC decoder 28. The CIRC decoder 28 performs an error correcting process for the main digital data. An interpolating circuit 29 interpolates the main digital data and outputs the interpolated data as reproduced data to an output terminal 30. Sub code data is supplied from the EFM demodulator 27 to a system controller 32.

The system controller 32 is composed of a microcomputer. The system controller 32 controls operations of the whole reproducing apparatus. In association with the system controller 32, an operation button and display portion 33 is disposed. The system controller 32 controls the servo portion 26 so as to access a desired position of the digital 21.

According to the present embodiment, as described above, a special pattern of which merging bits selected in the EFM modulation when DSV is controlled according to the relation of an immediately preceded code symbol and a code symbol immediately followed thereby are different from merging bits selected in the EFM modulation when DSV is controlled according to the relation of that code symbol and a code symbol further immediately followed thereby is recorded on the disc 21. The EFM modulator 12 of the master apparatus shown in FIG. 1 has the merging bit selecting portion 14 and the DSV controlling portion 15. As shown in FIG. 19, the merging bit selecting portion 14 and the DSV controlling portion 15 perform the merging bit selecting process according to not only the relation of an immediately preceded code symbol and a code symbol immediately followed thereby, but also the relation of those code symbol and a code symbol further immediately followed thereby that is pre-read. Thus, in such a special pattern, merging bits are added so that DSV finally converges to "0". Thus, when an original disc 21 is used, the special pattern portion can be reproduced.

However, a conventional CD-R disc recording apparatus selects merging bits of which DSV approaches to "0" in the EFM modulation according to the relation of an immediately preceded code symbol and a code symbol immediately followed thereby. Thus, when data is copied from the original disc 21, in the special pattern of the copied disc, DSV does not converge to "0". As a result, the DC balance is lost and the reproducing operation cannot be performed. Consequently, the copying operation can be prevented.

Figure 22:
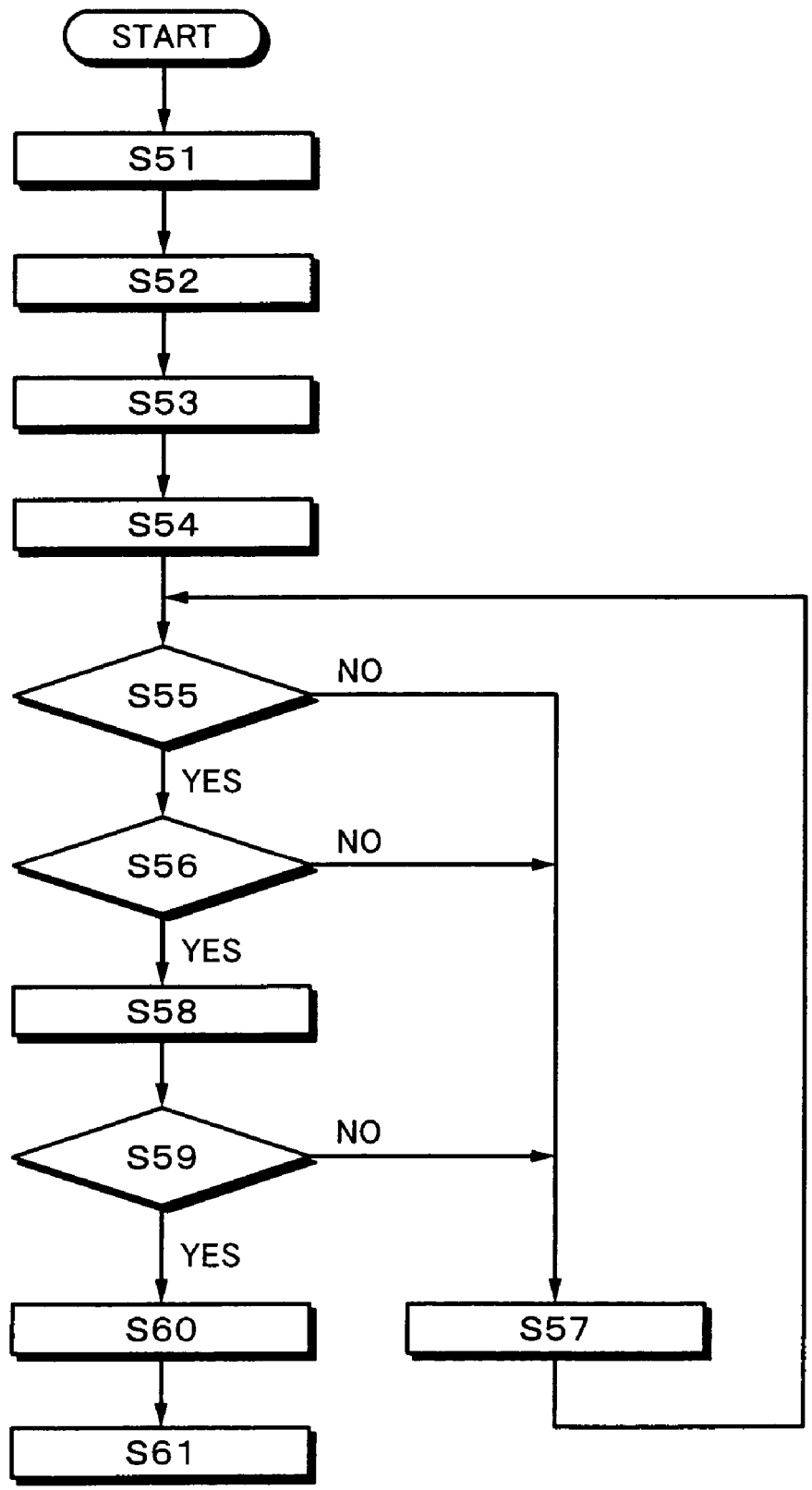
FIG. 22 is a flow chart describing a merging bit selecting process performed by a conventional modulator.

FIG. 22 is a flow chart showing a merging bit controlling process performed by a conventional EFM modulator disposed in a CD-R disc drive and a CD-RW disc drive.

As shown in FIG. 23A, an immediately preceded data symbol is denoted by D0, a data symbol of eight bits immediately followed thereby is denoted by D1, a data symbol of eight bits further immediately followed thereby is denoted by D2, and other data symbols further immediately followed thereby are denoted by D3, D4, . . . and so forth.

As shown in FIG. 23B, these code symbols D0, D1, D2, D3, D4, . . . and so forth are converted into code symbols of 14 bits. These converted code symbols are denoted by d1, d2, d3, . . . and so forth. Alternatives of four patterns of merging bits placed between the code symbol d0 and the code symbol d1 are denoted by MPn ((MP0=000), MP1 (MP1=001), MP2 (MP2=010), and MP3 (MP3=100).

In FIG. 22, when merging bits placed between the code symbol d0 and the code symbol d1 immediately followed thereby are selected, the data symbol D1 of eight bits is input (at step S51). The data symbol D1 is converted into the code symbol d1 of 14 bits according to the conversion table (at step S52). Thereafter, merging bits placed between the current code symbol d1 and the code symbol d0 immediately preceded thereby are selected (at step S53).

At first, n=0 is set (at step S54). With the merging bits MP0 (MP0=000), the immediately preceded code symbol d0 and the current code symbol d1 are tried to be connected (at step S54). With the merging bits MP0, the immediately preceded code symbol d0 and the current code symbol d1 are tried to be connected and it is determined whether or not the run length limit condition of the minimum inversion period (Tmin=3T) is satisfied (at step S55). When the condition of the minimum inversion period (Tmin=3T) is satisfied, it is determined whether or not the run length limit condition of the maximum inversion period (Tmax=11T) is satisfied (at step S56).

When the condition of the minimum inversion period (Tmin=3T) is not satisfied at step S55 or when the condition of the maximum inversion period (Tmax =11T) is not satisfied at step S56, n is incremented (at step S57). With the merging bits MPn+1, the immediately preceded code symbol d0 and the current code symbol d1 are tried to be connected and it is determined whether or not the run length limit condition of the minimum inversion period (Tmin=3T) is satisfied (at step S55). When the condition of the minimum inversion period (Tmin=3T) is satisfied, it is determined whether or not the run length limit condition of the maximum inversion period (Tmax=11T) is satisfied (at step S56).

When the condition of the minimum inversion period (Tmin=3T) is satisfied at step S55 and when the condition of the maximum inversion period (Tmax=11T) is satisfied at step S56, as merging bits that satisfy the run length limit conditions, the information is stored (at step S58). Thereafter, it is determined whether or not (n=3) is satisfied (at step S59). When (n=3) is not satisfied, n is incremented (at step S57). With the next merging bits MPn+1, the immediately preceded code symbol d0 and the current code symbol d1 are tried to be connected and it is determined whether or not the run length limit condition of the minimum inversion period (Tmin=3T) is satisfied (at step S55). When the condition of the minimum inversion period (Tmin=3T) is satisfied, it is determined whether or not the run length limit condition of the maximum inversion period (Tmax=11T) is satisfied (at step S56).

By repeating the foregoing process, n advances from "0" to "3". With the merging bits MP0 (MP0=000), MP1 (MP1=001), MP2 (MP2=010), and MP3 (MP3=100), the code symbol d0 and the code symbol d1 are connected and it is determined whether or not the run length limit conditions of the minimum inversion period (Tmin=3T) and the maximum inversion period (Tmax=11T) are satisfied. Information of merging bits that satisfy the run length limit conditions is stored at step S58.

When the determined result at step S59 represents that (n=3) is satisfied, with the merging bits MPn that satisfy the-conditions, DSV is calculated. In other words, according to the information stored at step S58, with alternative merging bits MPn that satisfy the conditions and that are placed between the code symbol d0 and the code symbol d1, DSV is obtained. The minimum value of absolute values of DSV is selected (at step S60). Thus, merging bits placed between the code symbol d0 and the code symbol d1 are decided (at step S61).

In the process shown in FIG. 22, merging bits placed between the code symbol d0 and the code symbol d1 are selected according to only the relation of the immediately preceded code symbol d0 and the current code symbol d1. In this case, when a special pattern shown in FIG. 2A, FIG. 2B, or FIG. 17A to FIG. 17E is contained, since DSV increases, the reproducing operation cannot be performed.

Figure 24:
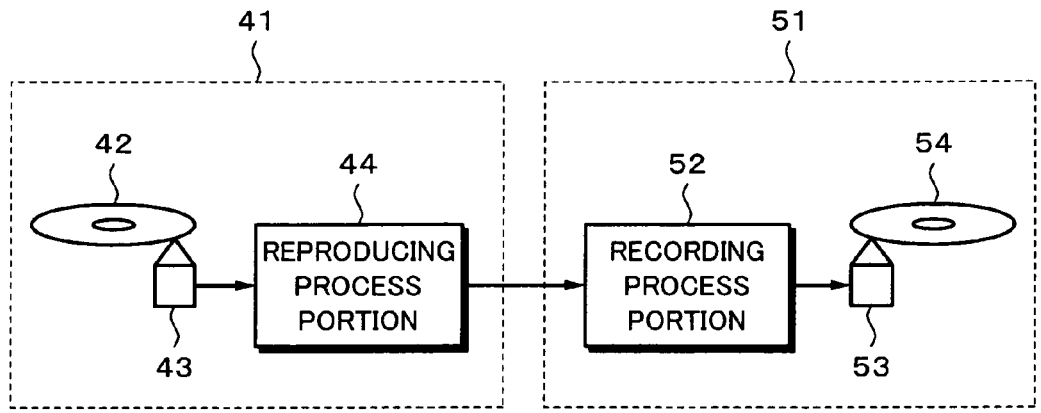
FIG. 24 is a block diagram describing a flow of a disc copying process.

FIG. 24 shows an outline of a flow of a copying process. A reproducing apparatus denoted by reference numeral 41 reproduces data from an original disc. As described above, the disc 21 is a CD format disc. A special pattern is contained at a predetermined position in such a manner that merging bits selected in the EFM modulation when DSV is controlled according to the relation of an immediately preceded code symbol and a code symbol immediately followed thereby are different from merging bits selected in the EFM modulation when DSV is controlled according to that code symbol and a code symbol further immediately followed thereby. Reference numeral 43 represents an optical pickup. Reference numeral 44 represents a reproduction signal process portion. Reproduced data is supplied from the reproducing apparatus 41 to a recording process portion 52 of a recording apparatus 51. An optical pickup 53 records the reproduced data to a disc 54, for example a CD-R disc. The recorded contents of the original disc 21 are copied to the CD-R disc 54. The reproducing apparatus 41 and the recording apparatus 51 can use a recording and reproducing apparatus structured as a CD-R disc drive or a CD-RW disc drive.

Figure 25:
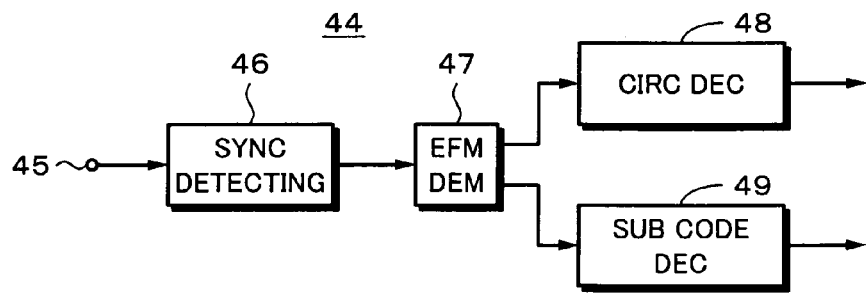
FIG. 25 is a block diagram showing an outline of a reproducing process portion when a disc copying process is performed.

As shown in FIG. 25, a sync detecting portion 46 of the reproducing process portion 44 detects a frame sync from a reproduced signal supplied from an input terminal 45. An EFM demodulator 47 EFM-demodulates the reproduced signal and supplies the EFM-demodulated reproduced data to a CIRC decoder 48. The CIRC decoder 48 corrects an error of the reproduced signal.

As described above, a special pattern shown in FIG. 2A, FIG. 2B, or FIG. 17A to FIG. 17E is contained at a predetermined position of the original disc 21 in such a manner that merging bits selected in the EFM modulation when DSV is controlled according to the relation of an immediately preceded code symbol and a code symbol immediately followed thereby are different from merging bits selected in the EFM modulation when DSV is controlled according to the relation of that code symbol and a code symbol further immediately followed thereby. The EFM modulator 12 of the mastering apparatus shown in FIG. 1 has the merging bit selecting portion 14 and the DSV controlling portion 15. As described above, the merging bit selecting portion 14 and the DSV controlling portion 15 perform the process for selecting merging bits according to not only the relation of an immediately preceded code symbol and a code symbol immediately followed thereby, but also the relation of that code symbol and a code symbol further immediately followed thereby that is pre-read. Thus, in such a special pattern, merging bits are added so that DSV finally converges to "0". Thus, the special pattern portion can be reproduced.

Figure 26:
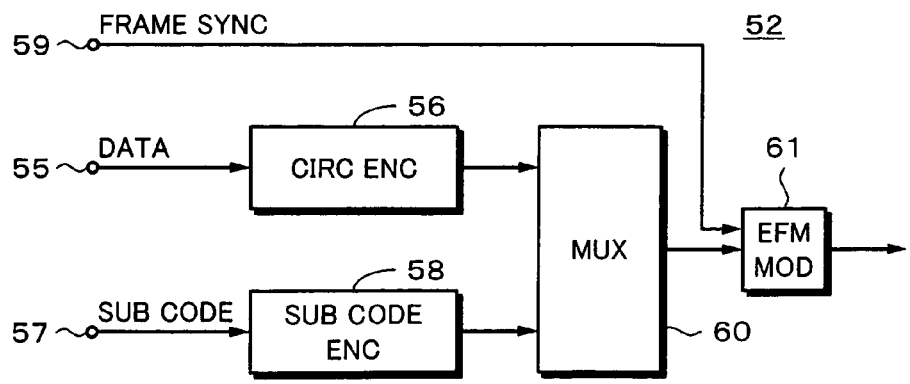
FIG. 26 is a block diagram showing an outline of a recording process portion when a disc copying process is performed.

FIG. 26 shows an outline of the structure of a recording process portion 52. Data to be recorded is supplied from an input terminal 55 to a CIRC encoder 56. The CIRC encoder 56 performs a CIRC encoding process for the data to be recorded. Sub code data is supplied from an input terminal 57 to a sub code encoder 58. The sub code encoder 58 formats the sub code. An output of the CIRC encoder 56 and an output of the sub code encoder 58 are supplied to a multiplexer 60. In addition, a frame sync is supplied from an input terminal 59 to the multiplexer 60. The multiplexer 60 arranges those data in a predetermined order. An output of the multiplexer 60 is supplied to an EFM modulator 61. The EFM modulator 61 performs an EFM modulating process for data that is output from the multiplexer 60.

As described above, the EFM modulator 61 normally selects merging bits of which DSV approaches to "0" according to the relation of an immediately preceded code symbol and a code symbol immediately followed thereby. Thus, when a reproduction signal of a portion of a special pattern at a predetermined position is sent to the EFM modulator 61, merging bits of which DSV approaches to "0" according to the relation of an immediately preceded code symbol and a code symbol immediately followed thereby are selected. As a result, DSV increases. The signal is recoded on a copy disc 54 such as a CD-R disc.

Thus, when the foregoing special pattern is recorded on the original disc 21, since a process for selecting merging bits according to not only the relation of an immediately preceded code symbol and a code symbol immediately followed thereby, but also the relation of that code symbol and a code symbol further immediately followed thereby is performed, in such a special pattern, merging bits are added so that DSV finally converges to "0". However, on the copied disc 54, merging bits of which DSV approaches to "0" according to the relation of an immediately preceded code symbol and a code symbol immediately followed thereby is selected. As a result, merging bits of which DSV increase are added. Thus, the reproducing operation cannot be performed.

In the foregoing example, on the original disc 21, the process for selecting merging bits according to not only the relation of an immediately preceded code symbol and a code symbol immediately followed thereby, but also the relation of that code symbol and a code symbol further immediately followed thereby that is pre-read is performed. However, if the special pattern has been predetermined, merging bits may be added so that merging bits added to the special pattern are different from merging bits added to the other portion. In this case, as the EFM modulator 12, a conventional modulator that selects merging bits of which DSV approaches to "0" according to the relation of an immediately preceded code symbol and a code symbol immediately followed thereby can be used.

The permission and prohibition of the use of contents other than the special pattern portion can be controlled. In other words, from a disc produced by the master apparatus according to the present invention, the data pattern portion can be reproduced. On the other hand, when a disc is produced by a conventional encoder using an original disc that has been produced by the master apparatus, the special pattern portion cannot be reproduced. Thus, depending on whether or not the pattern portion can be read, the disc is detected as an original disc or a copy thereof. According to the detected result, it is determined whether or not contents recorded in other than the data pattern portion can be used. As a result, contents of a copied disc can be prohibited from being used.

The special pattern would be placed in a key data portion of encrypted contents. From a copied disc, the key data portion would be prohibited from being reproduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention. For example, as a modulating system other than EFM, the present invention can be applied to EFM Plus. The EFM Plus is a system that converts a data symbol of eight bits into a code symbol of 16 bits without need to use merging bits. In the EFM Plus, there are special data patterns of which DSV increases. Thus, when an encoder that has a modified code conversion table modified from the standard code conversion table is used, even if a special data pattern is used, DSV can be prevented from increasing. Thus, it can be determined whether or not a disc to be used is an original disc of which data was recorded using an encoder according to the present invention or a copied disc of which data was recorded using a conventional encoder.

The present invention can be also applied to a multi-session optical disc on which for example CD-DA formatted data and CD-ROM formatted data are recorded. As information that is recorded to an optical disc, there are various types of data such as audio data, video data, still picture data, character data, computer graphic data, game software, and computer programs. Thus, the present invention can be applied to for example a DVD video disc and a DVD-ROM disc. In addition, the present invention can be applied to not only a disc-shaped data recording medium, but also a card-shaped data recording medium.

In the foregoing example, an original disc is produced by the mastering apparatus. Alternatively, an original disc may be produced with a CD-R disc or a CD-RW disc. When a special pattern is recorded, since it does not require to physically deform a disc with for example pits, even if an original disc is a recording medium using wobble pits such as a CD-R disc or a CD-RW disc, a copy can be protected.

As is clear from the foregoing description, according to the present invention, a special pattern is recorded on a recording medium in such a manner that merging bits selected in the EFM modulation when DSV is controlled according to the relation of an immediately preceded code symbol and a code symbol immediately followed thereby are different from merging bits selected in the EFM modulation when DSV is controlled according to the relation of those code symbol and a code symbol further immediately followed thereby. The EFM modulating portion of the master apparatus that produces an original CD selects merging bits according to not only the relation of an immediately preceded code symbol and a code symbol immediately followed thereby, but also the relation of that code symbol and a code symbol further immediately followed thereby that is pre-read. Thus, even if an original recording medium produced by the master apparatus contains such a special pattern, merging bits are selected so that DSV converges to "0". In contrast, when a CD-R recording apparatus or the like copies a data of a disc, the EFM modulating portion of the CD-R recording apparatus selects merging bits of which DSV approaches "0" according to only the relation of an immediately preceded code symbol and a code symbol immediately followed thereby, not the relation of that code symbol and a code symbol further immediately followed thereby. Thus, in the special pattern, since DSV increases, the reproducing operation cannot be performed. As a result, the copying operation can be restricted.

According to the present invention, without need to physically deform a disc with for example pits, a copying operation can be prohibited for not only a disc having wobble pits, but also an original recording medium that is a CR-R or CD-RW.

In addition, according to the present invention, since data cannot be reproduced from a copied recording medium, data of an original recording medium can be prevented from being directly copied.

In addition, according to the present invention, since a defect is not intentionally placed on an original medium, the present invention can be used as a format standard.

The invention claimed is:

1. A recording method for converting m-bit data into a n-bit (where n>m) data symbol whose run length is restricted and placing a connection bit after the n-bit data symbol so that the cumulative value of DC components per unit time becomes small, the recording method comprising the steps of:

selecting a first connection bit to be added to an immediately preceding data symbol from a plurality of connection bits according to at least one first connection bit that can be added between the immediately preceding data symbol and a first data symbol immediately following the immediately preceding data symbol and according to at least one second connection bit that can be added between the first data symbol and at least one second data symbol immediately following the first data symbol;

adding the selected first connection bit to the immediately preceding data symbol so as to generate record data; and recording the generated record data on a recording medium.

2. The recording method as set forth in claim 1, wherein the selecting step comprises the steps of:

selecting a first group including at least one first connection bit that can be added between the immediately preceding data symbol and the first data symbol immediately following the immediately preceding data symbol;

selecting a second group including at least one second connection bit that can be added between the first data symbol and the at least one second data symbol immediately following the first data symbol; and selecting the first connection bit from the selected first group and the second connection bit from the selected second group so that the cumulative value of the DC components becomes small.

3. The recording method as set forth in claim 2, wherein the first connection bit selecting step is performed by selecting the first connection bit so that when the selected first connection bit and the selected second connection bit are combined, the cumulative value of the DC components becomes small.

4. A recording method for converting m-bit data into a n-bit (where n>m) data symbol whose run length is restricted and adding a connection bit after the n-bit data symbol so that the cumulative value of DC components per unit time becomes small, the recording method comprising the steps of:

selecting a first connection bit to be added to an immediately preceding data symbol, when the immediately preceding data symbol is a special data symbol, from a plurality of connection bits according to at least one first connection bit that can be added between the immediately preceding data symbol and a first data symbol immediately following the immediately preceding data symbol and according to at least one second connection bit that can be added between the first data symbol and at least one second data symbol immediately following the first data symbol;

adding the selected first connection bit to the immediately preceding data symbol so as to generate record data; and recording the generated record data on a recording medium.

5. The recording method as set forth in claim 4, wherein the selecting step comprises the steps of:

selecting a first group including at least one first connection bit that can be added between the immediately preceding data symbol and the first data symbol immediately following the immediately preceding data symbol;

selecting a second group including at least one second connection bit that can be added between the first data symbol and the at least one second data symbol immediately following the first data symbol; and selecting the first connection bit from the selected first group and the second connection bit from the selected second group so that the cumulative value of the DC components becomes small.

6. The recording method as set forth in claim 5, wherein the first connection bit selecting step is performed by selecting the first connection bit so that when the selected first connection bit and the selected second connection bit are combined, the cumulative value of the DC components becomes small.

7. The recording method as set forth in claim 4, wherein the second connection bit added between the first data symbol and the second data symbol is unconditionally selected when the first data symbol is selected according to the immediately preceding data symbol and the first data symbol, with the special data symbol.

8. The recording method as set forth in claim 4, wherein the m-bit data is modulated according to an 8-14 modulating system.

9. A recording method for converting m-bit data into n-bit (where n>m) data whose run length is restricted and recording the converted data on a recording medium, the recording method comprising the step of:

selecting a first n-bit data according to an immediately preceding n-bit data, the first n-bit data immediately following the immediately preceding n-bit data, and a second n-bit data immediately following the first n-bit data so that the cumulative value of DC components per unit time becomes small, wherein the n-bit data is composed of a n1-bit data symbol and n2-bit (=n n1) connection bits immediately following the n1-bit data symbol and selected from a plurality of connection bits so that the cumulative value of DC components per unit time becomes small; and selecting a first connection bit to be added to the immediately preceding data symbol according to at least one connection bit that can be added between the immediately preceding data symbol and the first data symbol and at least one second connection bit that can be added between the first data symbol and the second data symbol.

10. The recording method as set forth in claim 9, wherein the selecting step comprises the steps of:

selecting a first group including at least one first connection bit that can be added between the immediately preceding data symbol and the first data symbol immediately following the immediately preceding data symbol;

selecting a second group including at least one second connection bit that can be added between the first data symbol and the second data symbol; and selecting the first connection bit from the selected first group and the second connection bit from the selected second group so that the cumulative value of the DC components becomes small.

11. The recording method as set forth in claim 10, wherein the first connection bit selecting step is performed by selecting the first connection bit so that when the selected first connection bit and the selected second connection bit are combined, the cumulative value of the DC components becomes small.

12. The recording method as set forth in claim 9, wherein the m-bit data is modulated according to an 8-14 modulating system.

13. The recording method as set forth in claim 9, wherein the m-bit data is modulated according to an 8-16 modulating system.

14. The recording method as set forth in claim 9, wherein the first connection bit is selected when the immediately preceding data symbol is a special symbol.

15. The recording method as set forth in claim 14, wherein the selecting step comprises the steps of:
selecting a first group including at least one first connection bit that can be added between the immediately preceding data symbol and the first data symbol immediately following the immediately preceding data symbol;
selecting a second group including at least one second connection bit that can be added between the first data symbol and the second data symbol; and
selecting the first connection bit from the selected first group and the second connection bit from the selected second group bit so that the cumulative value of the DC components becomes small.

16. The recording method as set forth in claim 15, wherein the first connection bit selecting step is performed by selecting the first connection bit so that when the selected first connection bit and the selected second connection bit are combined, the cumulative value of the DC components becomes small.

17. The recording method as set forth in claim 14, wherein, the second connection bit added between the first data symbol and the second data symbol is unconditionally selected when the first data symbol is selected according to the immediately preceding data symbol and the first data symbol, with the special data symbol.

18. A recording apparatus, comprising:
an encoding process portion configured to perform an encoding process for input data;
a converting portion configured to convert m-bit data that is output from the encoding processing portion into n-bit (where n>m) data whose run length is restricted by selecting a first n-bit data according to an immediately preceding n-bit data, the first n-bit data immediately following the immediately preceding n-bit data, and a second n-bit data immediately following the first n-bit data so that the cumulative value of DC components per unit time becomes small, and
select a first connection bit to be added to an immediately preceding data symbol according to a first group including at least one first connection bit that can be added between the immediately preceding data symbol and a first data symbol and a second group including at least one second connection bit that can be added between the first data symbol and a second data symbol,
wherein the n-bit data is composed of a n1-bit data symbol and n2-bit (=n-n1) connection bits immediately following the n1-bit data symbol and selected from a plurality of connection bits so that the cumulative value of DC components per unit time becomes small; and
a recording portion for recording data that is output from the converting portion on a recording medium.

19. The recording apparatus as set forth in claim 18, wherein the converting portion is configured to select at least one first connection bit that can be added between the immediately preceding data symbol and the first data symbol immediately following the immediately preceding data symbol, select at least one second connection bit that can be added between the first data symbol and the second data symbol, and select the first connection bit from the selected first connection bit and the second connection bit so that the cumulative value of the DC components becomes small.

20. The recording apparatus as set forth in claim 19, wherein the converting portion is configured to select the first connection bit so that when the selected first connection bit and the selected second connection bit are combined, the cumulative value of the DC components becomes small.

21. The recording apparatus as set forth in claim 18, wherein the m-bit data is modulated according to an 8-14 modulating system.

22. The recording apparatus as set forth in claim 18, wherein the m-bit data is modulated according to an 8-16 modulating system.

23. The recording apparatus as set forth in claim 18, wherein the converting portion is configured to select the first connection bit when the immediately preceding data symbol is a special data symbol.

24. The recording apparatus as set forth in claim 23, wherein the converting portion is configured to select the first group including at least one first connection bit that can be added between the immediately preceding data symbol and the first data symbol immediately following the preceding data symbol, select the second group including at least one second connection bit that can be added between the first data symbol and the second data symbol, and select the first connection bit from the selected first group and the second connection bit from the selected second group so that the cumulative value of the DC components becomes small.

25. The recording apparatus as set forth in claim 24, wherein the converting portion is configured to select the first connection bit so that when the selected first connection bit and the selected second connection bit are combined, the cumulative value of the DC components becomes small.

26. The recording apparatus as set forth in claim 23, wherein the second connection bit added between the first data symbol and the second data symbol is unconditionally selected when the first data symbol is selected according to the immediately preceding data symbol and the first data symbol, with the special data symbol.

27. A recording medium, comprising:
a first n-bit data is selected, when m-bit data is converted into n-bit (where n>m) data whose run length is restricted, according to an immediately preceding n-bit data, the first n-bit data immediately following the immediately preceding n-bit data and a second n-bit data immediately following the first n-bit data so that the cumulative value of DC components per unit time becomes small and the selected first n-bit data is recorded after the immediately preceded n-bit data, wherein the n-bit data is composed of a m-bit data symbol and n2-bit (=n-n1) connection bits immediately following the n1-bit data symbol and selected from a plurality of connection bits so that the cumulative value of DC components per unit time becomes small, and wherein a first connection bit to be added to the immediately preceding data symbol is selected according to at least one connection bit that can be added between the immediately preceding data symbol and the first data symbol and at least one second connection bit that can be added between the first data symbol and the second data symbol and recorded on the recording medium.

28. The recording medium as set forth in claim 27, wherein a first group including at least one first connection bit that can be added between the immediately preceding data symbol and the first data symbol immediately following the immediately preceding data symbol is selected, wherein a second group including at least one second connection bit that can be added between the first data symbol and the second data symbol is selected, wherein the first connection bit is selected from the selected first group and the second connection bit is selected from the selected second group so that the cumulative value of the DC components becomes small, and wherein the resultantly selected first connection bit is recorded on the recording medium.

29. The recording medium as set forth in claim 28, wherein the first connection bit is selected so that when the selected first connection bit and the selected second connection bit are combined, the cumulative value of the DC components becomes small, and wherein the resultantly selected first connection bit is recorded on the recording medium.

30. The recording medium as set forth in claim 27, wherein the m-bit data is modulated according to an 8-14 modulating system and recorded on the recording medium.

31. The recording medium as set forth in claim 27, wherein the m-bit data is modulated according to an 8-16 modulating system and recorded on the recording medium.

32. The recording medium as set forth in claim 27, wherein the first connection bit is selected when the immediately preceding data symbol is a special data symbol.

33. The recording medium as set forth in claim 32, wherein a first group including at least one first connection bit that can be added between the immediately preceding data symbol and the first data symbol immediately following the immediately preceding data symbol is selected, wherein a second group including at least one second connection bit that can be added between the first data symbol and the second data symbol is selected, and wherein the first connection bit is selected from the selected first group and the second connection bit from the selected second group so that the cumulative value of the DC components becomes small, and wherein the resultantly selected first connection bit is recorded on the recording medium.

34. The recording medium as set forth in claim 33, wherein the first connection bit is selected so that when the selected first connection bit and the selected second connection bit are combined, the cumulative value of the DC components becomes small, and wherein the resultantly selected first connection bit is recorded on the recording medium.

35. The recording medium as set forth in claim 32, wherein, the second connection bit added between the first data symbol and the second data symbol is unconditionally selected when the first data symbol is selected according to the immediately preceding data symbol and the first data symbol, with the special data symbol.

36. A data converting method, comprising the step of:

selecting a first n-bit data, when m-bit data is converted into n-bit (where n>m) data whose run length is restricted, according to an immediately preceding n-bit data, the first n-bit data immediately following the immediately preceding n-bit data and a second n-bit data immediately following the first n-bit data so that the cumulative value of DC components per unit time becomes small, wherein the n-bit data is composed of a m-bit data symbol and n2-bit (=n n1) connection bits immediately following the n1-bit data symbol and selected from a plurality of connection bits so that the cumulative value of DC components per unit time becomes small; and selecting a first connection bit to be added to the immediately preceding data symbol according to at least one connection bit that can be added between the immediately preceding data symbol and the first data symbol and at least one second connection bit that can be added between the first data symbol and the second data symbol.

37. The data converting method as set forth in claim 36, wherein the selecting step comprises the steps of:

selecting a first group including at least one first connection bit that can be added between the immediately preceding data symbol and the first data symbol immediately following the immediately preceding data symbol;

selecting a second group including at least one second connection bit that can be added between the first data symbol and the second data symbol; and selecting the first connection bit from the selected first group the second connection bit from the selected second group so that the cumulative value of the DC components becomes small.

38. The data converting method as set forth in claim 37, wherein the first connection bit selecting step is performed by selecting the first connection bit so that when the selected first connection bit and the selected second connection bit are combined, the cumulative value of the DC components becomes small.

39. The data converting method as set forth in claim 36, wherein the m-bit data is modulated according to an 8-14 modulating system.

40. The data converting method as set forth in claim 36, wherein the m-bit data is modulated according to an 8-16 modulating system.

41. The data converting method as set forth in claim 36, wherein the first connection bit is selected when the immediately preceding data symbol is a special data symbol.

42. The data converting method as set forth in claim 41, wherein the selecting step comprises the steps of:
- selecting a first group including at least one first connection bit that can be added between the immediately preceding data symbol and the first data symbol immediately following the immediately preceding data symbol;
- selecting a second group including at least one second connection bit that can be added between the first data symbol and the second data symbol; and
- selecting the first connection bit from the selected first group and the second connection bit from the selected second group so that the cumulative value of the DC components becomes small.

43. The data converting method as set forth in claim 42, wherein the first connection bit selecting step is performed by selecting the first connection bit so that when the selected first connection bit and the selected second connection bit are combined, the cumulative value of the DC components becomes small.

44. The data converting method as set forth in claim 41, wherein when the first data symbol is selected according to the immediately preceding data symbol and the first data symbol, with the special data symbol, the second connection bit added between the first data symbol and the second data symbol is unconditionally selected.

* * * * *

UNITED STATES PATENT AND TRADEMARK OFFICE
CERTIFICATE OF CORRECTION

PATENT NO. : 7,289,046 B2
APPLICATION NO. : 10/483622
DATED : October 30, 2007
INVENTOR(S) : Yoichiro Sako et al.

It is certified that error appears in the above-identified patent and that said Letters Patent is hereby corrected as shown below:

Column 9, line 65, change "11T" to --"1T"--.

Column 23, line 33, delete "bit".

Column 24, line 61, delete "is" first occurrence.

Column 25, line 3, change "a m-bit" to --a n1-bit--.

Column 26, line 24, change "a m-bit" to --a n1-bit--;

line 25, change "(= n n1)" to --(= n-nl)--;

line 48, after "group" insert --and--.

Signed and Sealed this

Twenty-fourth Day of June, 2008

JON W. DUDAS
*Director of the United States Patent and Trademark Office*